(12) United States Patent
Li et al.

(10) Patent No.: US 11,688,767 B2
(45) Date of Patent: Jun. 27, 2023

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: Ming-Shuan Li, Zhudong Township, Hsinchu County (TW); Ming-Lung Cheng, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 31 days.

(21) Appl. No.: 17/184,922

(22) Filed: Feb. 25, 2021

(65) Prior Publication Data

US 2022/0271124 A1 Aug. 25, 2022

(51) Int. Cl.
*H01L 29/06* (2006.01)
*H01L 29/66* (2006.01)
*H01L 29/78* (2006.01)

(52) U.S. Cl.
CPC .... *H01L 29/0673* (2013.01); *H01L 29/66553* (2013.01); *H01L 29/7848* (2013.01)

(58) Field of Classification Search
CPC ......... H01L 21/02603; H01L 21/28141; H01L 21/823431; H01L 21/823821; H01L 21/845; H01L 27/0886; H01L 27/0924; H01L 27/10879; H01L 27/1211; H01L 29/0653; H01L 29/0665; H01L 29/0669; H01L 29/0673; H01L 29/41791; H01L 29/66439; H01L 29/6653; H01L 29/66553; H01L 29/6656; H01L 29/66795; H01L 29/775; H01L 29/785; H01L 29/7851; H01L 29/7853; H01L 29/7855; H01L 2029/7858
See application file for complete search history.

(56) References Cited

U.S. PATENT DOCUMENTS

| | | | |
|---|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |

(Continued)

*Primary Examiner* — David C Spalla
(74) *Attorney, Agent, or Firm* — Birch, Stewart, Kolasch & Birch, LLP

(57) ABSTRACT

A semiconductor device structure includes first nanostructures formed over a substrate. The structure also includes a first gate structure wrapped around the first nanostructures. The structure also includes first source/drain epitaxial structures formed over opposite sides of the first nanostructures. The structure also includes second nanostructures formed over the first nanostructure. The structure also includes a second gate structure wrapped around the second nanostructures. The structure also includes second source/drain epitaxial structures formed over opposite sides of the second nanostructures. The first gate structure and the second gate structure have different conductivity types, and the Ge concentration of the first nanostructures and the Ge concentration of the second nanostructures are different.

20 Claims, 36 Drawing Sheets

(56) References Cited

U.S. PATENT DOCUMENTS

| | | |
|---|---|---|
| 9,536,738 B2 | 1/2017 | Huang et al. |
| 9,576,814 B2 | 2/2017 | Wu et al. |
| 9,608,116 B2 | 3/2017 | Ching et al. |
| 2019/0081155 A1* | 3/2019 | Xie .................. H01L 29/66553 |
| 2019/0221483 A1* | 7/2019 | Mulfinger .............. B82Y 10/00 |
| 2020/0294988 A1* | 9/2020 | Ryu .................... H01L 23/5286 |
| 2020/0402984 A1* | 12/2020 | Reznicek .......... H01L 29/66545 |
| 2021/0407999 A1* | 12/2021 | Huang ................ H01L 27/0688 |
| 2021/0408285 A1* | 12/2021 | Hickey ............. H01L 29/66545 |
| 2022/0149176 A1* | 5/2022 | More ................ H01L 29/66439 |

* cited by examiner

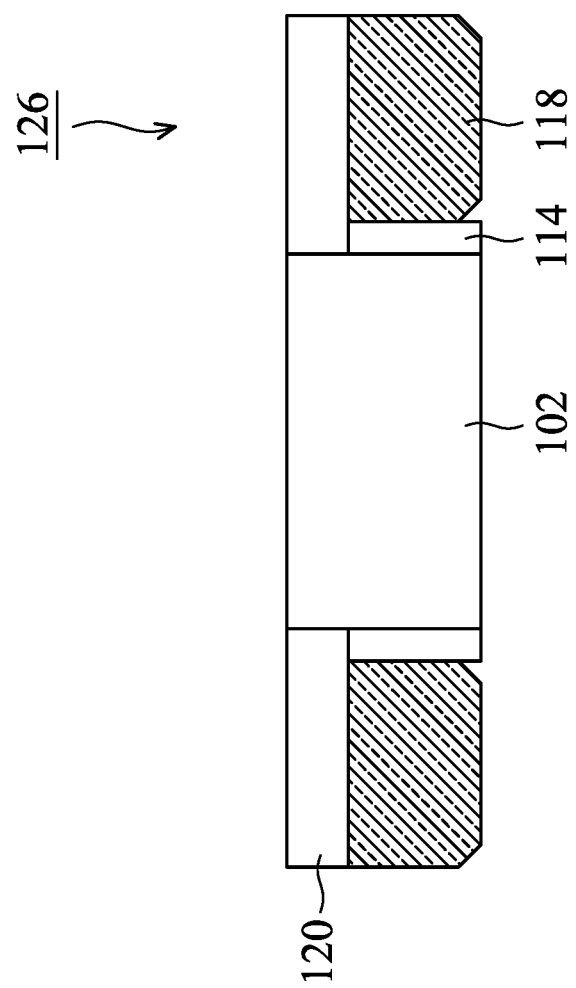

SEMICONDUCTOR DEVICE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes.

However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1, 2A-2, 2B-1, 2B-2, 2C-1, 2C-2, 2D-1, 2D-2, 2D-3, 2E-1, 2E-2, 2E-3, 2F-1, 2F-2, 2F-3, 2G-1, 2G-2, 2G-3, 2H-1, 2H-2, 2H-3, 2I-1, 2I-2, 2I-3 are cross-sectional representations of various stages of forming a semiconductor device structure, in accordance with some embodiments of the disclosure.

FIG. 3 is an enlarged cross-sectional representation of a semiconductor device structure, in accordance with some embodiments of the disclosure.

DETAILED DESCRIPTION

Figure 1:
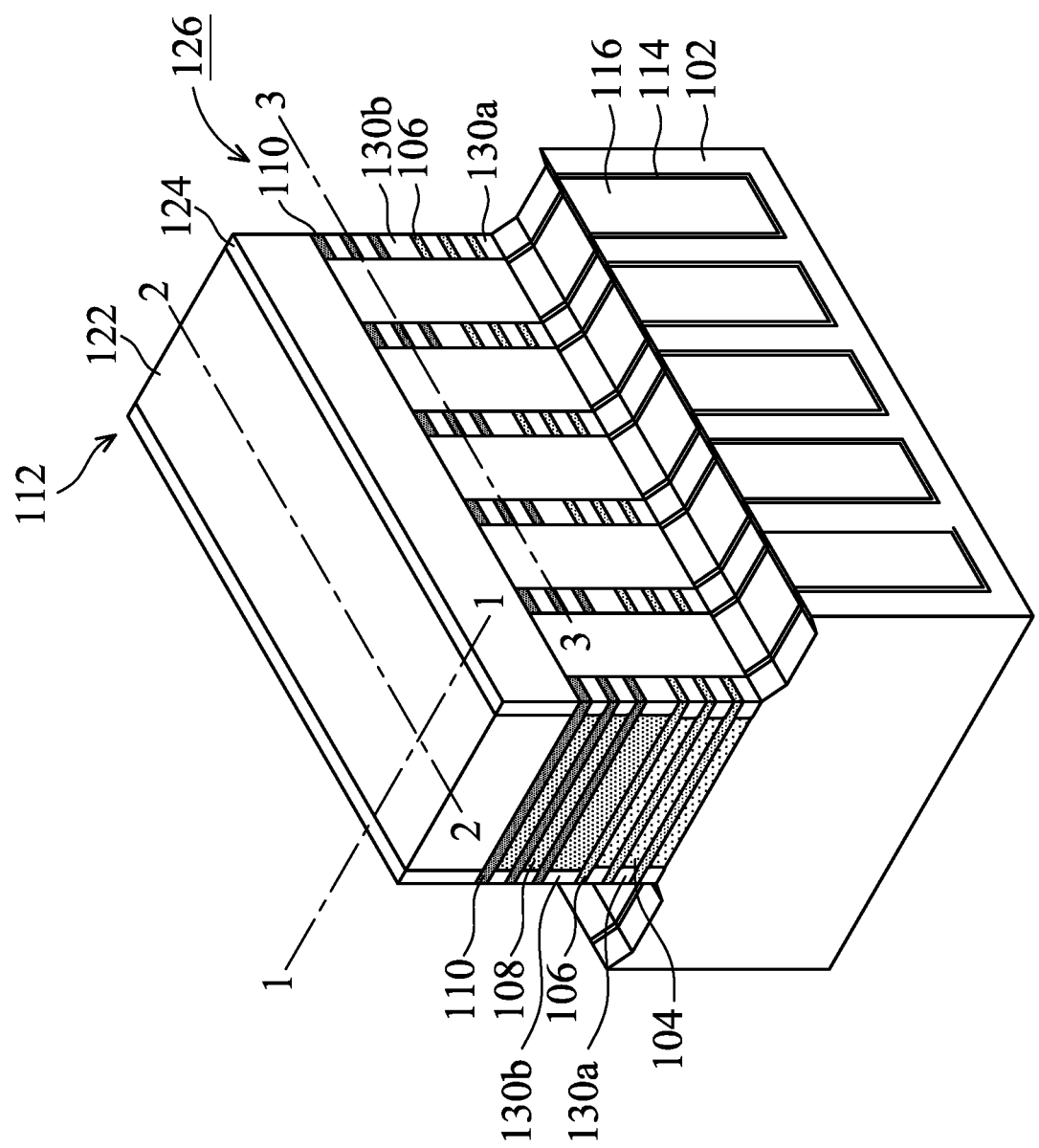
FIG. 1 is a perspective representation of a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a semiconductor device structure are provided. The method for forming the semiconductor device structure may include stacking NFET and PFET between the buried power rails. PFET mobility may be enhanced by increasing the Ge concentration in PFET channel region. In addition, the inner spacer and the nanostructures of both NFET and PFET may be formed at the same time.

FIG. 1 is a perspective representation of a semiconductor device structure 10a, in accordance with some embodiments of the disclosure. The semiconductor device structure 10a is a gate all around (GAA) transistor structure. FIGS. 2A-1, 2A-2, 2B-1, 2B-2, 2C-1, 2C-2, 2D-1, 2D-2, 2D-3, 2E-1, 2E-2, 2E-3, 2F-1, 2F-2, 2F-3, 2G-1, 2G-2, 2G-3, 2H-1, 2H-2, 2H-3, 2I-1, 2I-2, 2I-3 are cross-sectional representations of various stages of forming the semiconductor device structure 10a, in accordance with some embodiments of the disclosure. FIGS. 2A-1, 2B-1, 2C-1, 2D-1, 2E-1, 2F-1, 2G-1, 2H-1, 2I-1 show cross-sectional representations taken along line 1-1 in FIG. 1. FIGS. 2A-2, 2B-2, 2C-2, 2D-2, 2E-2, 2F-2, 2G-2, 2H-2, 2I-2 show cross-sectional representations taken along line 2-2 in FIG. 1. FIGS. 2E-3, 2F-3, 2G-3, 2H-3, 2I-3 show cross-sectional representations taken along line 3-3 in FIG. 1.

Figures 1, 2A:
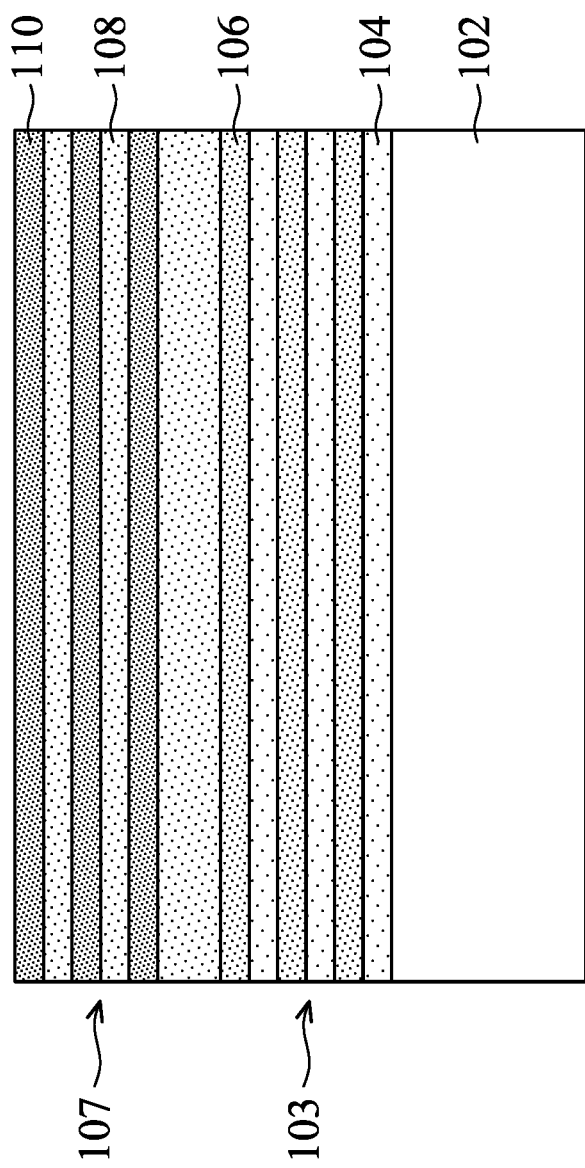
Figures 2, 2A:
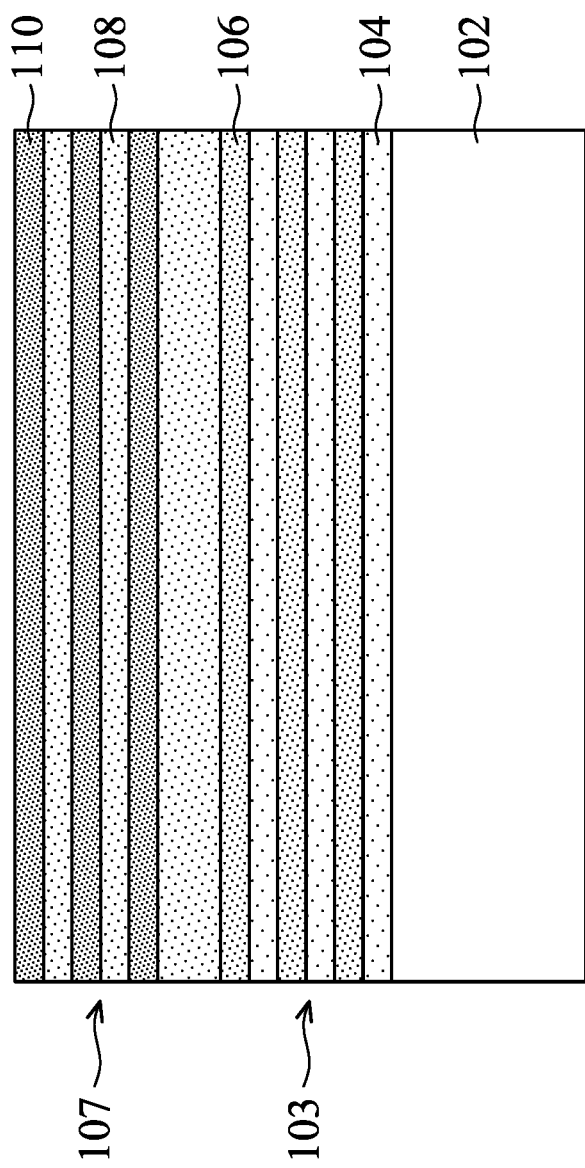

A substrate 102 is provided as shown in FIGS. 1, 2A-1, and 2A-2 in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 may be an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, a first semiconductor stack 103 including first semiconductor layers 104 and second semiconductor layers 106 are alternating stacked over the substrate 102. The first semiconductor layers 104 and the second semiconductor layers 106 may include Si, Ge, SiGe, GaAs, InSb, GaP, GaSb, InAlAs, InGaAs, GaSbP, GaAsSb, or InP. The first semiconductor layers 104 and second semiconductor layers 106 may be made of different materials with different etching rates. In some embodiments, the first semiconductor layers 104 and the second semiconductor layers 106 includes SiGe with different Ge concentration. In some embodiments, the Ge concentration of the first semiconductor layers 104 is higher than the Ge concentration of the second semiconductor layers 106. In some embodiments, the first semiconductor layers 104 have a Ge concentration of about 30% to about 40%, and the second semiconductor layers 106 have a Ge concentration of about 10% to about 20%.

The first semiconductor layers 104 and the second semiconductor layers 106 may be formed by low pressure chemical vapor deposition (LPCVD) process, epitaxial growth process, other applicable methods, or a combination thereof. The epitaxial growth process may include molecular beam epitaxy (MBE), metal organic chemical vapor deposition (MOCVD), or vapor phase epitaxy (VPE).

It should be noted that, although there are three layers of first semiconductor layers 104 and three layers of second semiconductor layers 106 shown in FIGS. 1, 2A-1, and 2A-2, the number of the first semiconductor layers 104 and second semiconductor layers 106 are not limited herein, depending on the demands of the manufacturing process and on performance requirements.

Next, a second semiconductor stack 107 including third semiconductor layers 108 and fourth semiconductor layers 110 are alternating stacked over the first semiconductor layers 104 and the second semiconductor layers 106. The third semiconductor layers 108 and the fourth semiconductor layers 110 may include Si, Ge, SiGe, GaAs, InSb, GaP, GaSb, InAlAs, InGaAs, GaSbP, GaAsSb, or InP. The third semiconductor layers 108 and the fourth semiconductor layers 110 may be made of different materials with different etching rates. In some embodiments, the third semiconductor layers 108 include SiGe, and the fourth semiconductor layers 110 include Si. In some embodiments, the Ge concentration of the first semiconductor layers 104 is higher than the Ge concentration of the third semiconductor layers 108, and the Ge concentration of the third semiconductor layers 108 is higher than the Ge concentration of the second semiconductor layers 106. In some embodiments, the Ge concentration of the second semiconductor layers 106 and the Ge concentration of the fourth semiconductor layers 110 are different. In some embodiments, the Ge concentration of the second semiconductor layers 106 is higher than the Ge concentration of the fourth semiconductor layers 110. In some embodiments, the third semiconductor layers 108 have a Ge concentration of about 20% to about 30%.

The third semiconductor layers 108 and fourth semiconductor layers 110 may be formed by low pressure chemical vapor deposition (LPCVD) process, epitaxial growth process, other applicable methods, or a combination thereof. The epitaxial growth process may include molecular beam epitaxy (MBE), metal organic chemical vapor deposition (MOCVD), or vapor phase epitaxy (VPE).

It should be noted that, although there are three layers of third semiconductor layers 108 and three layers of fourth semiconductor layers 110 shown in FIGS. 1, 2A-1, and 2A-2, the number of the third semiconductor layers 108 and fourth semiconductor layers 110 are not limited herein, depending on the demands of the manufacturing process and on performance requirements.

Figures 1, 2B:
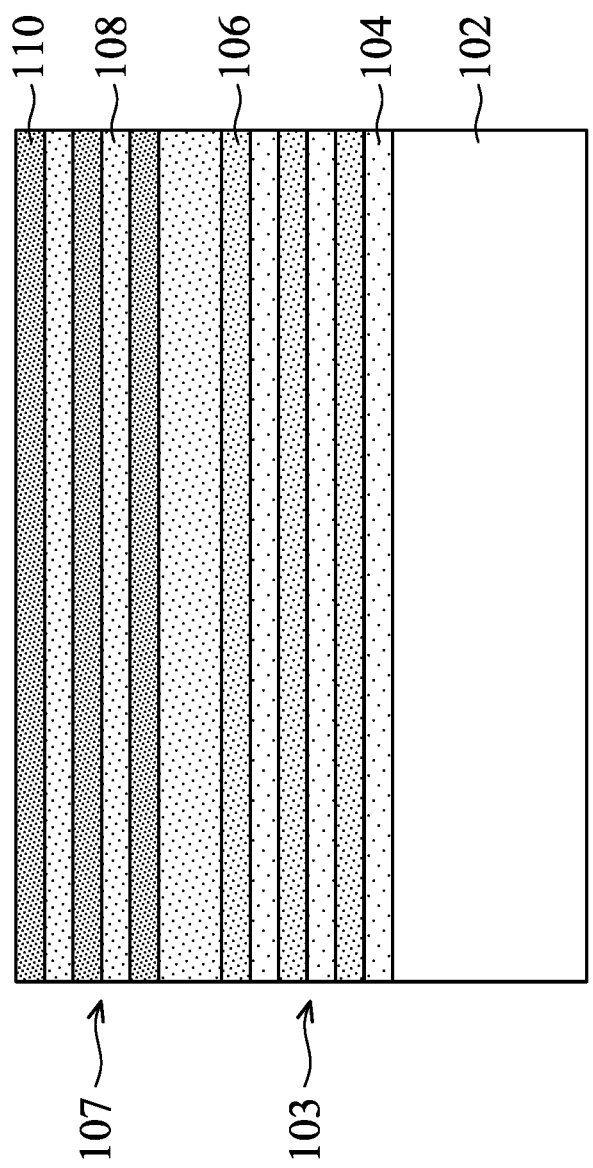
Figures 2, 2B:
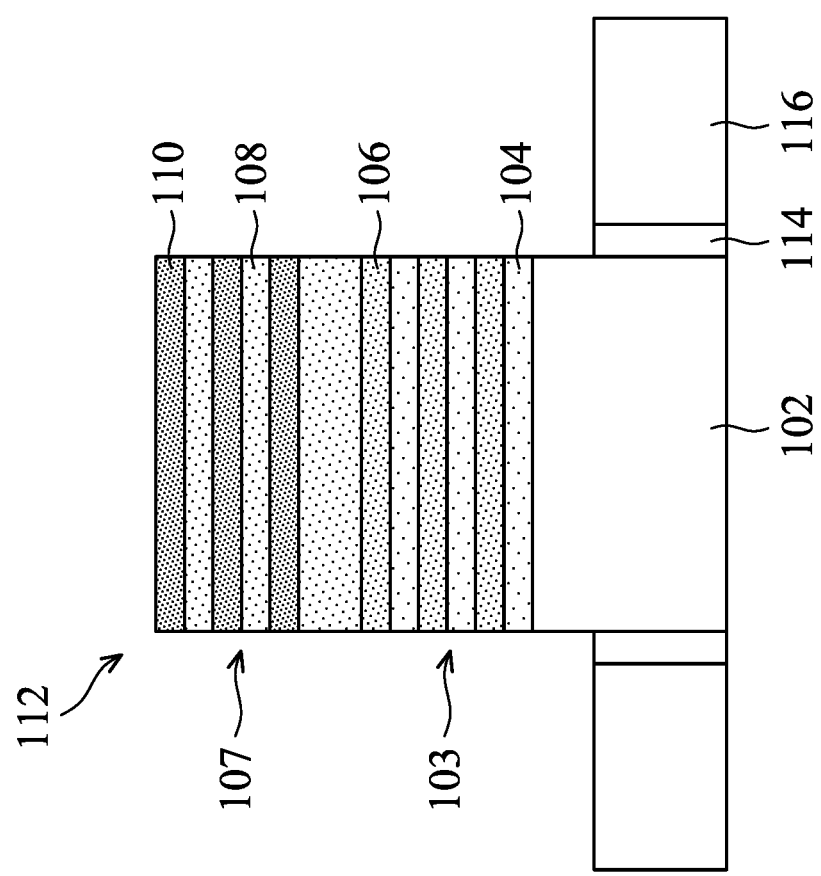

Next, a hard mask layer may be formed and patterned over the first semiconductor layers 104, the second semiconductor layers 106, the third semiconductor layers 108, and the fourth semiconductor layers 110 (not shown). The first semiconductor layers 104, the second semiconductor layers 106, the third semiconductor layers 108, and the fourth semiconductor layers 110 may be patterned to form fin structures 112 using the patterned hard mask layer as a mask layer, as shown in as shown in FIGS. 1 and 2B-2 in accordance with some embodiments. The patterning process may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

After the fin structures 112 are formed, a liner layer 114 is formed in the trenches between the fin structures 112, as shown in FIGS. 1 and 2B-2 in accordance with some embodiments. The liner layer 114 may be conformally formed over the substrate 102, the fin structure 112, and the hard mask layer covering the fin structure 112. The liner layer 114 may be used to protect the fin structure 112 from being damaged in the following processes (such as an anneal process or an etching process). In some embodiments, the liner layer is made of silicon nitride. The liner layer 114 may be formed by using a thermal oxidation, a CVD process, an atomic layer deposition (ALD) process, a LPCVD process, a plasma enhanced CVD (PECVD) process, a HDPCVD process, a flowable CVD (FCVD) process, another applicable process, or a combination thereof.

Next, an isolation structure material 116 may be then filled over the liner layer 114 in the trenches between the fin structures 112, as shown in FIGS. 1 and 2B-2 in accordance with some embodiments. The isolation structure 116 may be made of silicon oxide, silicon nitride, silicon oxynitride, fluoride-doped silicate glass (FSG), or another low-k dielectric material. The isolation structure 116 may be deposited by a deposition process, such as a chemical vapor deposition (CVD) process, a spin-on-glass process, or another applicable process.

Next, an etching process may be performed on the isolation structure 116 and the liner layer 114. The etching process may be used to remove a top portion of the liner layer 114 and a top portion of the isolation structure 116. As a result, the first semiconductor layers 104, the second semiconductor layers 106, the third semiconductor layers 108, and the fourth semiconductor layers 110 may be exposed and the remaining isolation structure 116 and the liner layer 114 may surround the base portion of the fin structure 112, as shown in FIGS. 1 and 2B-2 in accordance with some embodiments. The remaining isolation structure 116 may be a shallow trench isolation (STI) structure surrounding the base portion of the fin structure 112. The isolation structure 116 may be configured to prevent electrical interference or crosstalk. Therefore, trenches may be formed between the fin structures 112.

Figures 1, 2C:
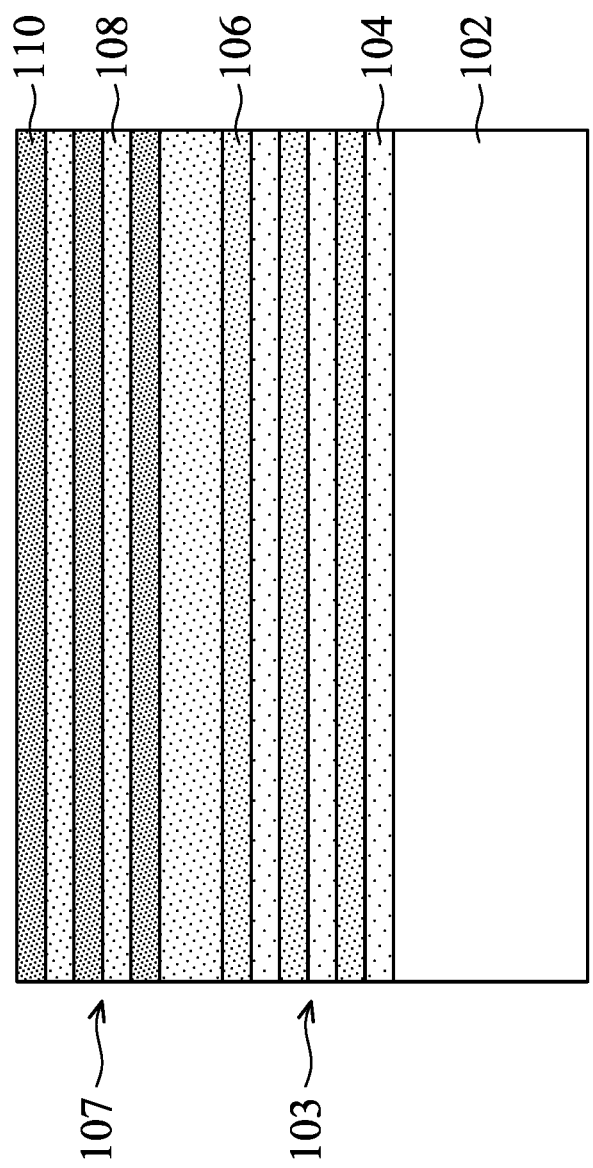
Figures 2, 2C:
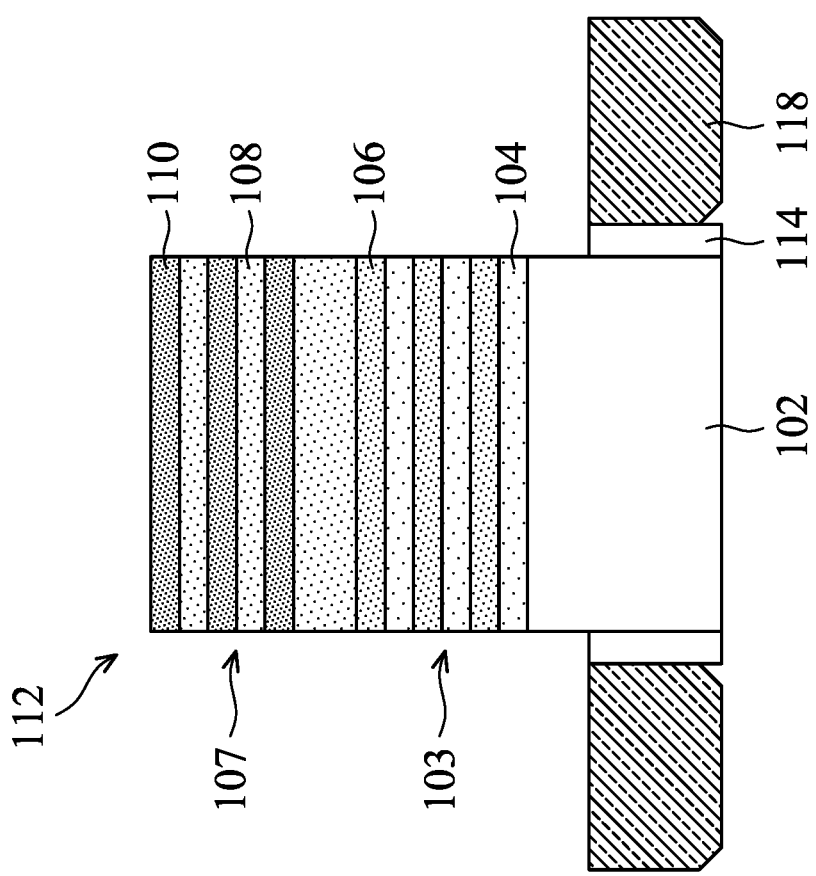

Next, a portion of the isolation structure 116 near the fin structure 112 is removed, and power rails 118 are formed beside the fin structure 112, as shown in FIG. 2C-2 in accordance with some embodiments. The power rails 118 may be made of ruthenium, copper, tungsten, aluminum, molybdenum, titanium, tantalum, palladium, platinum, cobalt, nickel, conductive metal oxides, other applicable low-resistance materials, or a combination thereof. The power rails 118 may be formed by a physical vapor deposition process (PVD, e.g., evaporation or sputtering), an atomic layer deposition process (ALD), an electroplating process, other applicable processes, or a combination thereof.

Figures 1, 2D:
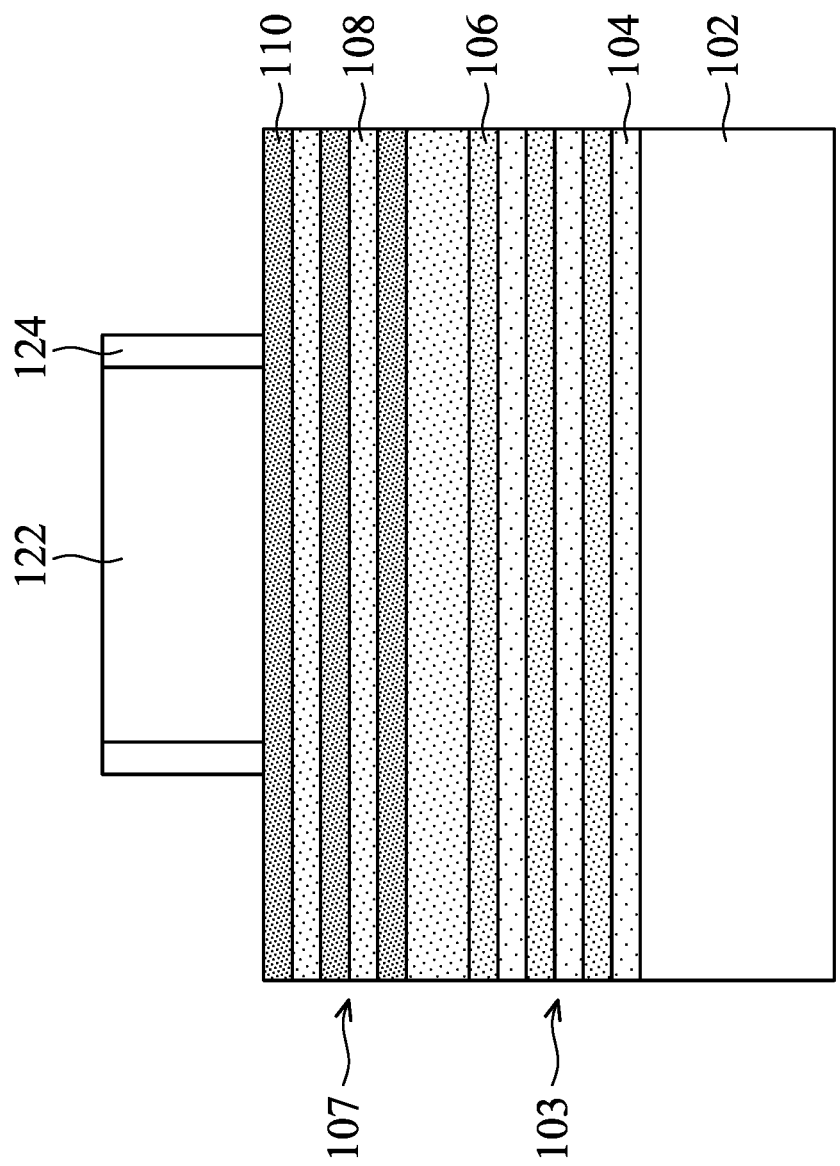
Figures 2, 2D:
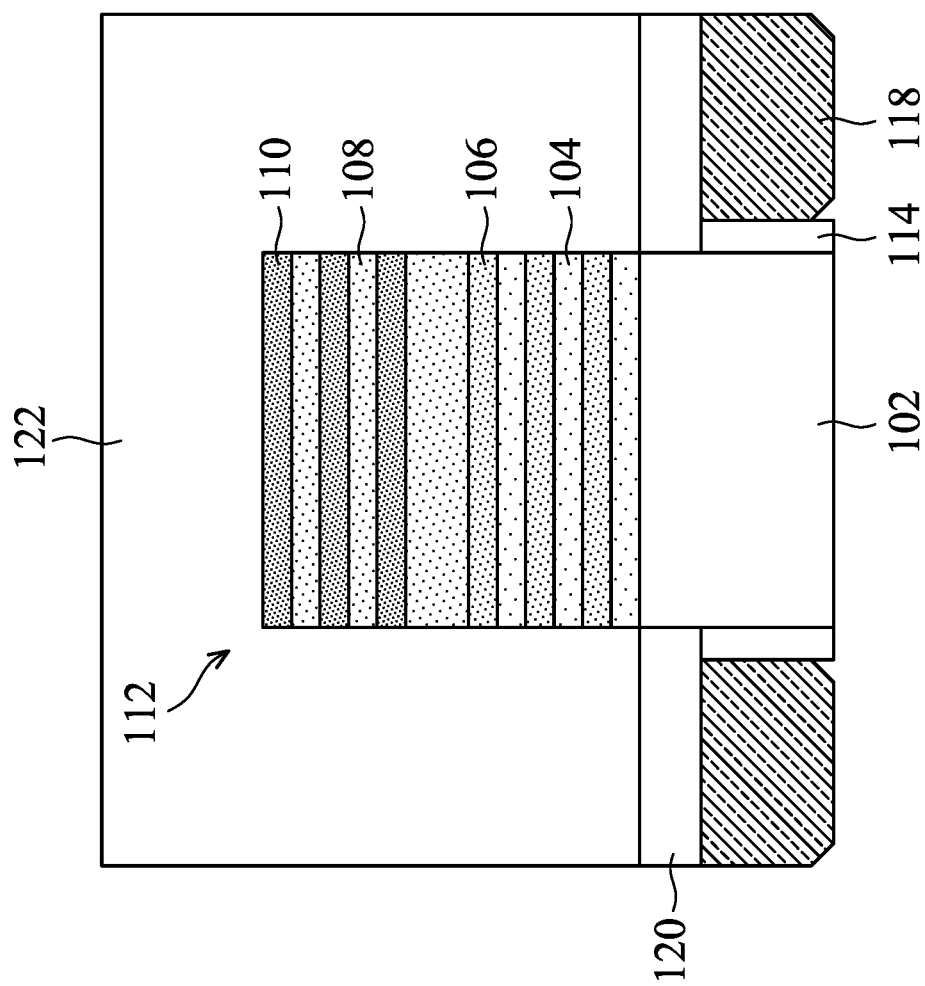
Figures 2, 2D, 3:
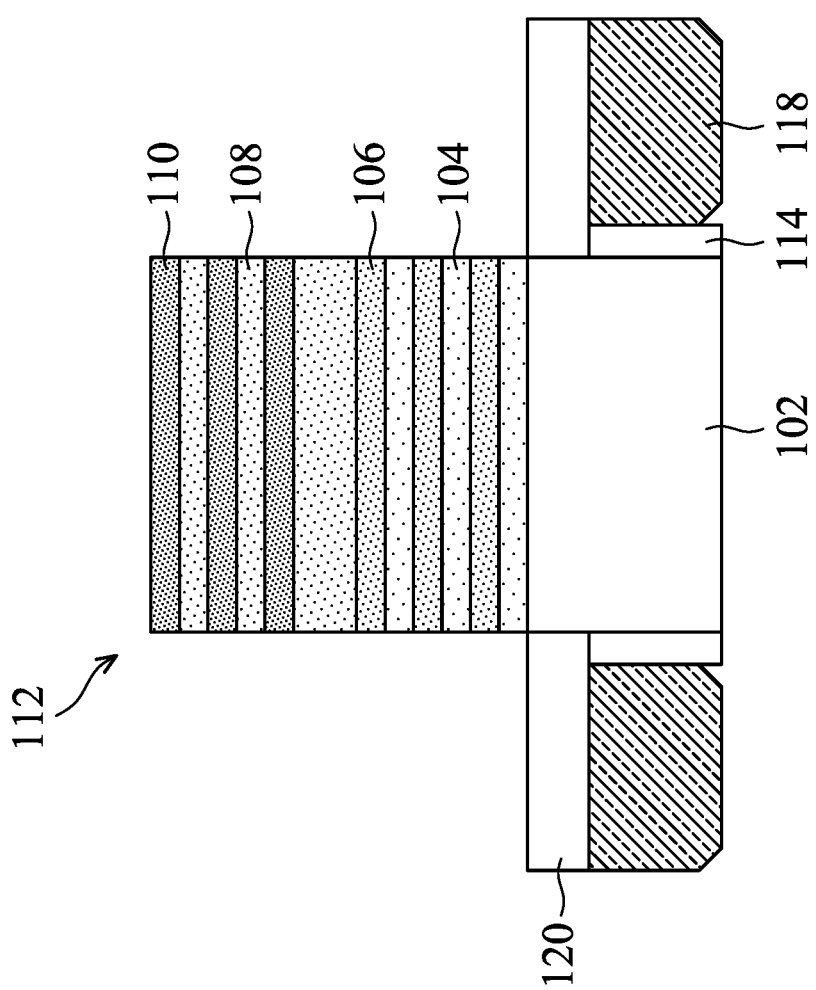

Next, a dielectric layer 120 is formed over the power rail 118, as shown in FIGS. 2D-2 and 2D-3 in accordance with some embodiments. The dielectric layer 120 may provide isolation between the power rails 118 and subsequently formed gate structure. The dielectric layer 120 may be made of silicon nitride, silicon oxide, silicon oxynitride, other insulating materials, or a combination thereof. The dielectric layer 120 may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

Next, a dummy gate structure 122 is formed over and across the fin structures 112, as shown in FIGS. 1, 2D-1, and 2D-2 in accordance with some embodiments. The dummy gate structure 122 may include a dummy gate dielectric layer and a dummy gate electrode layer. The dummy gate dielectric layer and the dummy gate electrode layer may be replaced by the following steps to form a real gate structure with a high-k dielectric layer and a metal gate electrode layer.

The dummy gate dielectric layer may include silicon oxide. The silicon oxide may be formed by an oxidation process (e.g., a dry oxidation process, or a wet oxidation process), a chemical vapor deposition process, other applicable processes, or a combination thereof. Alternatively, the gate dielectric layer may include a high-k dielectric layer (e.g., the dielectric constant is higher than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, $(Ba, Sr)TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The dummy gate electrode layer may include polycrystalline-silicon (poly-Si), poly-crystalline silicon-germanium (poly-SiGe), metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, and tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), other applicable materials, or a combination thereof. The dummy gate electrode layer may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Afterwards, an etching process may be performed on the dummy gate dielectric layer and the dummy gate electrode layer to form the dummy gate structure 122 by using a patterned photoresist layer as a mask (not shown). The etching process may be a dry etching process or a wet etching process. The dummy gate dielectric layer and the dummy gate electrode layer may be etched by a dry etching process. The dry etching process may include using a fluorine-based etchant gas, such as $SF_6$, $C_xF_y$ (where x and y may be positive integers), $NF_3$, or a combination thereof. After the etching process, the first semiconductor layers 104, the second semiconductor layers 106, the third semiconductor layers 108, and the fourth semiconductor layers 110 may be exposed on opposite sides of the dummy gate structure 122, as shown in FIG. 2D-1.

Next, a pair of spacer layers 124 is formed on opposite sidewalls of the dummy gate structure 122, as shown in FIGS. 1 and 2D-1 in accordance with some embodiments. The spacer layers 124 may be made of silicon oxide, silicon nitride, silicon oxynitride, and/or dielectric materials. The spacer layers 124 may be formed by a chemical vapor deposition (CVD) process, a spin-on-glass process, or another applicable process.

Afterwards, the first semiconductor layers 104, the second semiconductor layers 106, the third semiconductor layers 108, and the fourth semiconductor layers 110 of the fin structure 112 exposed on opposite sides of the dummy gate structure 122 may be removed in an etching process to form a source/drain opening 126, as shown in FIGS. 1, 2E-1 and 2E-3 in accordance with some embodiments. The etching process may be a dry etching process or a wet etching process. The fin structures 112 may be etched by a dry etching process. The dry etching process may include using a fluorine-based etchant gas, such as $SF_6$, $C_xF_y$ (where x and y may be positive integers), $NF_3$, or a combination thereof.

FIG. 3 is an enlarged cross-sectional representation of a semiconductor device structure, in accordance with some embodiments. Next, the first semiconductor layers 104, the second semiconductor layers 106, and the third semiconductor layers 108 are laterally etched from the source/drain opening 126 to form recesses 128, as shown in FIG. 3 in accordance with some embodiments. The outer portions of the first semiconductor layers 104, the second semiconductor layers 106, and the third semiconductor layers 108 may be removed, and the inner portions of the first semiconductor layers 104, the second semiconductor layers 106, and the third semiconductor layers 108 under the dummy gate structures 114 and the spacer layers 124 may remain. The lateral etching of the first semiconductor layers 104, the second semiconductor layers 106, and the third semiconductor layers 108 may be a dry etching process, a wet etching process, or a combination thereof.

As shown in FIG. 3, after the lateral etching, the sidewalls of the first semiconductor layers 104 is exposed from the recess 128a, and the sidewalls of the third semiconductor layers 108 is exposed from the recess 128b.

Due to different Ge concentrations, the lateral etching selectivity of the first semiconductor layers 104, the second semiconductor layers 106, and the third semiconductor layers 108 may be different. In some embodiments, the lateral etching selectivity increases with higher Ge concentration. In some embodiments, the etching rate of the first semiconductor layers 104 and the etching rate of the third semiconductor layers 108 are greater than the etching rate of the second semiconductor layers 106. Therefore, after lateral etching, the sidewalls of the etched first semiconductor layers 104, the second semiconductor layers 106, and the third semiconductor layers 108 may not be aligned with the sidewalls of the fourth semiconductor layers 110.

As shown in FIG. 3, after the lateral etching, the width W4 of the fourth semiconductor layers 110 is greater than the width W2 of the second semiconductor layers 106, and the width W2 of the second semiconductor layers 108 is greater than the width W3 of the semiconductor layers 108. Moreover, the width W3 of the semiconductor layers 108 is greater than the width W1 of the semiconductor layers 104. With different etching selectivity of the semiconductor layers 104/106/108/110 due to different Ge concentration, the widths W1/W2/W3/W4 of the semiconductor layers 104/106/108/110 may decrease as the Ge concentration increases.

Figures 1, 2E:
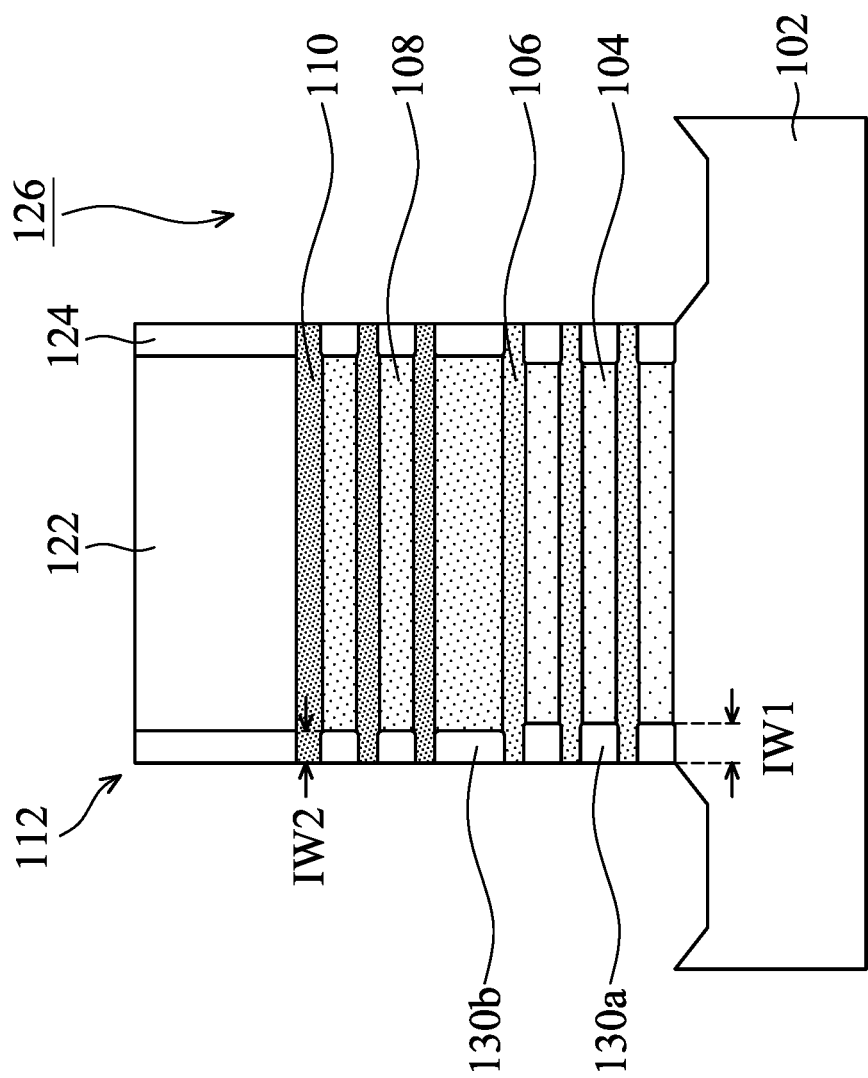
Figures 2, 2E:
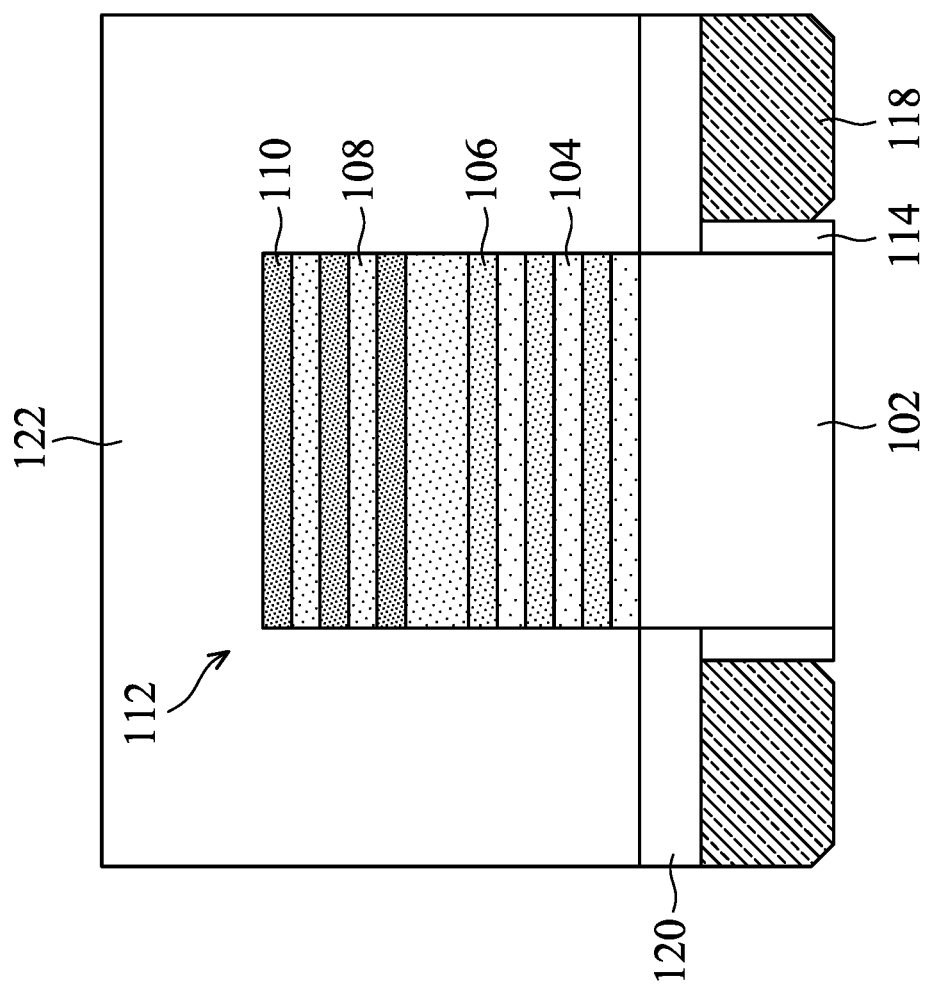

In some embodiments, the first semiconductor layers 104, the second semiconductor layers 106, and the third semiconductor layers 108 are laterally etched by chemical including $CF_4$, $O_2$, $NF_3$, $CHF_3$, $CH_3F$, or a combination thereof. In some embodiments, the first semiconductor layers 104, the second semiconductor layers 106, and the third semiconductor layers 108 are laterally etching under a temperature of about 25° C. to about 80° C. In some embodiments, the first semiconductor layers 104, the second semiconductor layers 106, and the third semiconductor layers 108 are laterally etching under a pressure of about 10 mT to about 100 mT. In some embodiments, the first semiconductor layers 104, the second semiconductor layers 106, and the third semiconductor layers 108 are laterally etching with a flow rate of about 20 sccm to about 150 sccm. If the temperature, the pressure, or the flow rate of the lateral etching is too great, the first semiconductor layers 104, the second semiconductor layers 106, and the third semiconductor layers 108 may be over etched. Therefore, the channel width may be reduced and performance may suffer. If the temperature, the pressure, or the flow rate is too low, the lateral etching of the first semiconductor layers 104, the second semiconductor layers 106, and the third semiconductor layers 108 may not be sufficient. Therefore, the inner spacer may be too thin, increasing the capacitance and leading to narrow process window for subsequently gate replacement process Next, a first inner spacer 130a is formed in the recess 128 beside the first semiconductor layers 104, and a second inner spacer 130b is formed in the recess 128 beside the third semiconductor layers 108, as shown in FIG. 2E-1 in accordance with some embodiments. The first inner spacer 130a and the second inner spacers 130b may provide a barrier between subsequently formed source/drain epitaxial structures and gate structure. The first inner spacer 130a and the second inner spacers 130b may be made of silicon oxide, silicon nitride, silicon carbon nitride (SiCN), silicon oxide carbonitride (SiOCN), or a combination thereof. The first inner spacer 130a and the second inner spacers 130b may be formed by a deposition process and an etch-back process. The deposition process may include a CVD process (such as LPCVD, PECVD, SACVD, or FCVD), an ALD process, another applicable method, or a combination thereof. The etch-back process may include a dry etching process or a wet etching process.

The widths of the inner spacers 130a and 130b may depend on the etching amount of the first semiconductor layers 104 and the third semiconductor layers 108. Since the recess 128 beside the first semiconductor layers 104 and the recess 128 beside the third semiconductor layers 108 have different widths, the width IW1 of the first inner spacer 130a and the thickness IW2 of the second inner spacer 130b are different. In some embodiments, the thickness IW1 of the first inner spacer 130a is greater than the thickness IW2 of the second inner spacer 130b.

Figures 1, 2F:
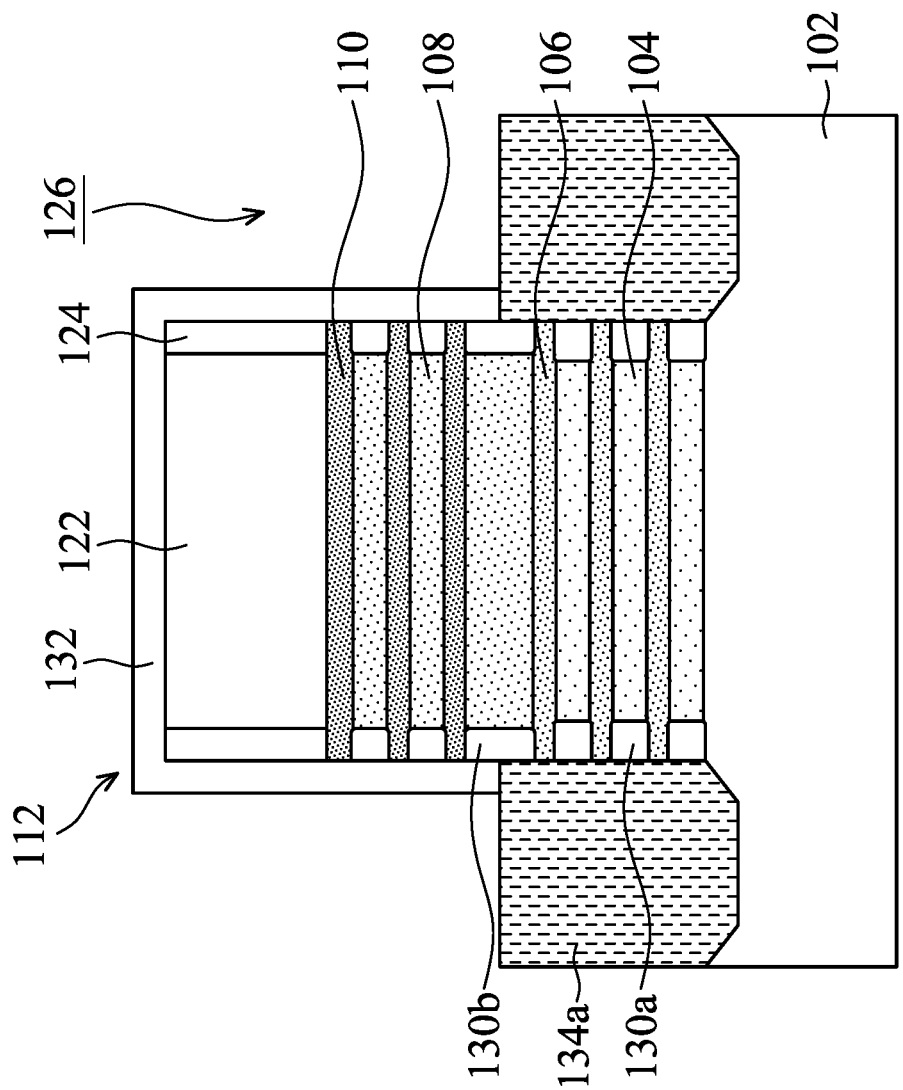
Figures 2, 2F:
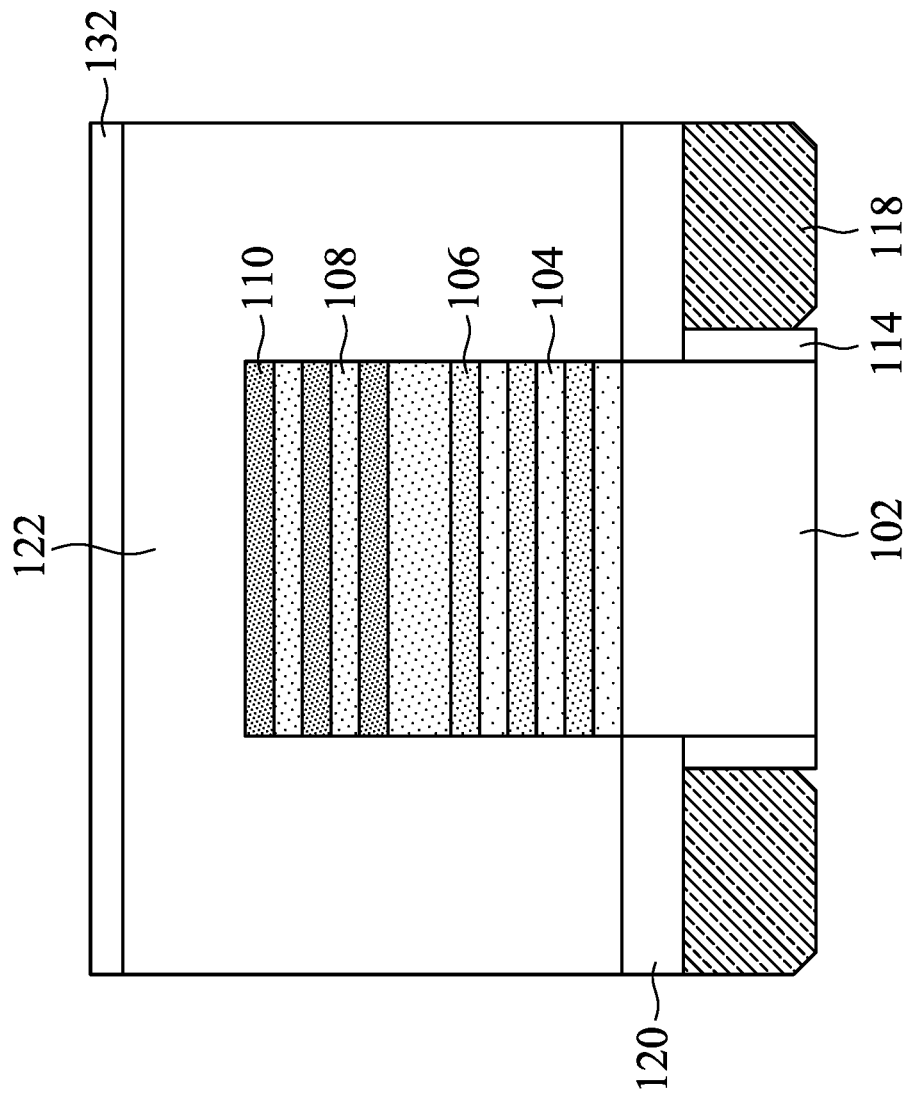
Figures 2, 2F, 3:
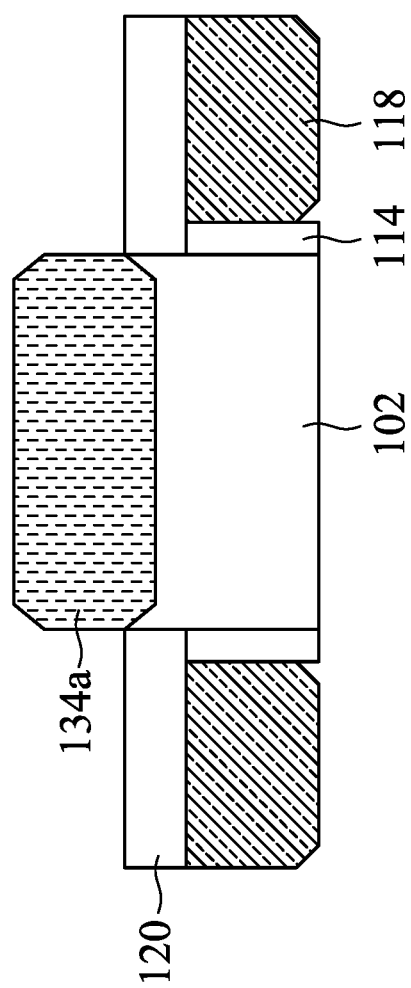

Next, a protection layer 132 is formed over the top portion of the fin structure 112, as shown in FIG. 2F-1 in accordance with some embodiments. As shown in FIGS. 2F-1 and 2F-2, the protection layer 132 covers the dummy gate structure 122, the spacer layers 124, and the sidewalls of the second semiconductor stack 107. The sidewall of the bottommost third semiconductor layers 108 may be exposed from the protection layer 132. The protection layer 132 may be made of silicon oxide, silicon nitride, silicon oxynitride, aluminum oxide, boron nitride, other applicable materials, or a combination thereof. The protection layer 132 may be formed by a CVD process (such as LPCVD, PECVD, SACVD, or FCVD), an ALD process, another applicable method, or a combination thereof.

Next, a first source/drain epitaxial structure 134a is formed in the source/drain opening 126, as shown in FIG. 2F-1 in accordance with some embodiments. As shown in FIG. 2F-1, the first source/drain epitaxial structure 134a is formed over opposite sides of the bottom portion of the fin structure 112. As shown in FIG. 2F-1, the first source/drain epitaxial structure 134a may be grown over the sidewalls of the fin structure 112 exposed from the protection layer 132. The first source/drain epitaxial structure 134a may be grown beside the first semiconductor layers 104 and the second semiconductor layers 106. The first source/drain epitaxial structure 134a may be grown over the sidewalls of the second semiconductor layers 106 and the first inner spacer 130a. The first source/drain epitaxial structure 134a may be grown over a portion of the sidewalls of the third semiconductor layers 108 not covered by the protection layer 132.

A strained material may be grown in the source/drain opening 126 by an epitaxial (epi) process to form the first source/drain epitaxial structure 134a. In addition, the lattice constant of the strained material may be different from the lattice constant of the substrate 102. The first source/drain epitaxial structure 134a may include Ge, SiGe, InAs, InGaAs, InSb, GaAs, GaSb, InAlP, InP, SiC, SiP, other applicable materials, or a combination thereof. The first source/drain epitaxial structure 134a may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method. The first source/drain epitaxial structure 134a may be doped with one or more dopants. In some embodiments, first source/drain epitaxial structure 134a has a first conductivity type. The first conductivity type may be P-type. In some embodiments, the first source/drain epitaxial structure 134a may be silicon germanium (SiGe) doped with boron (B) or another applicable dopant.

Figures 1, 2G:
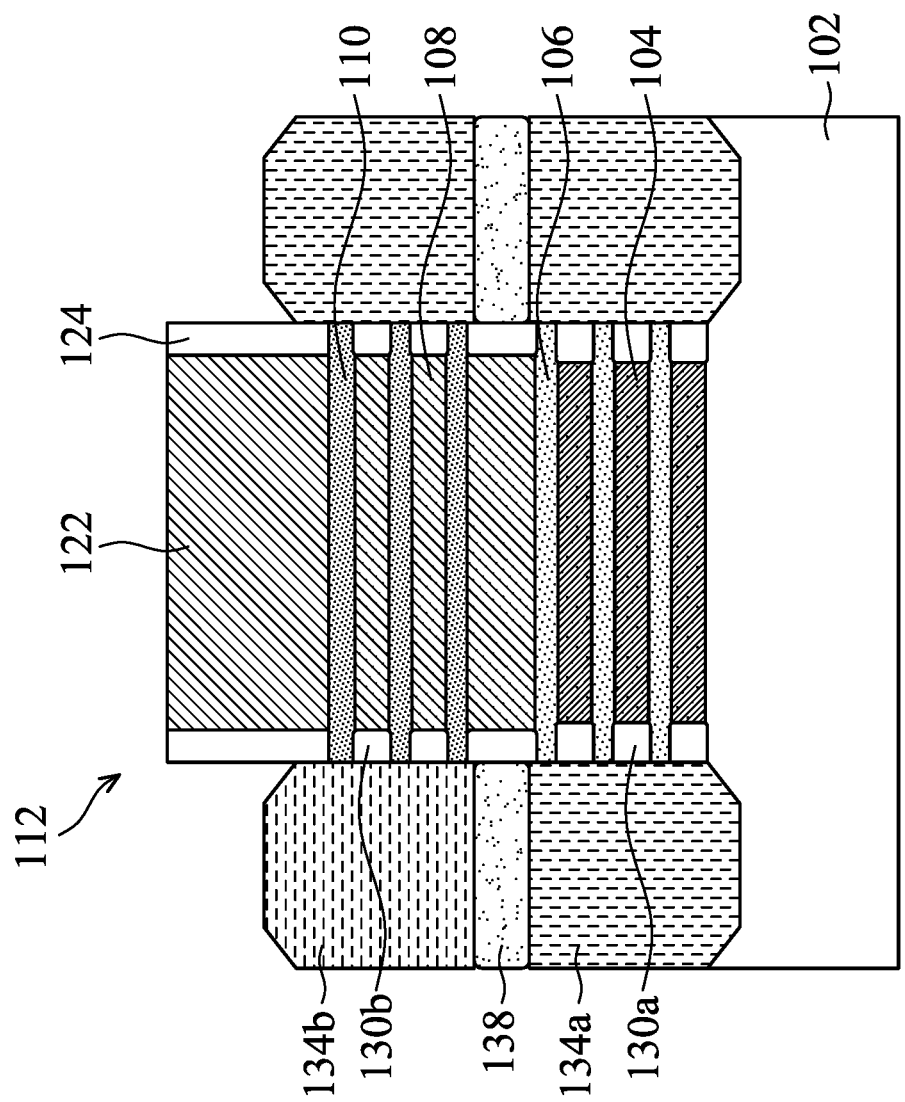
Figures 2, 2G:
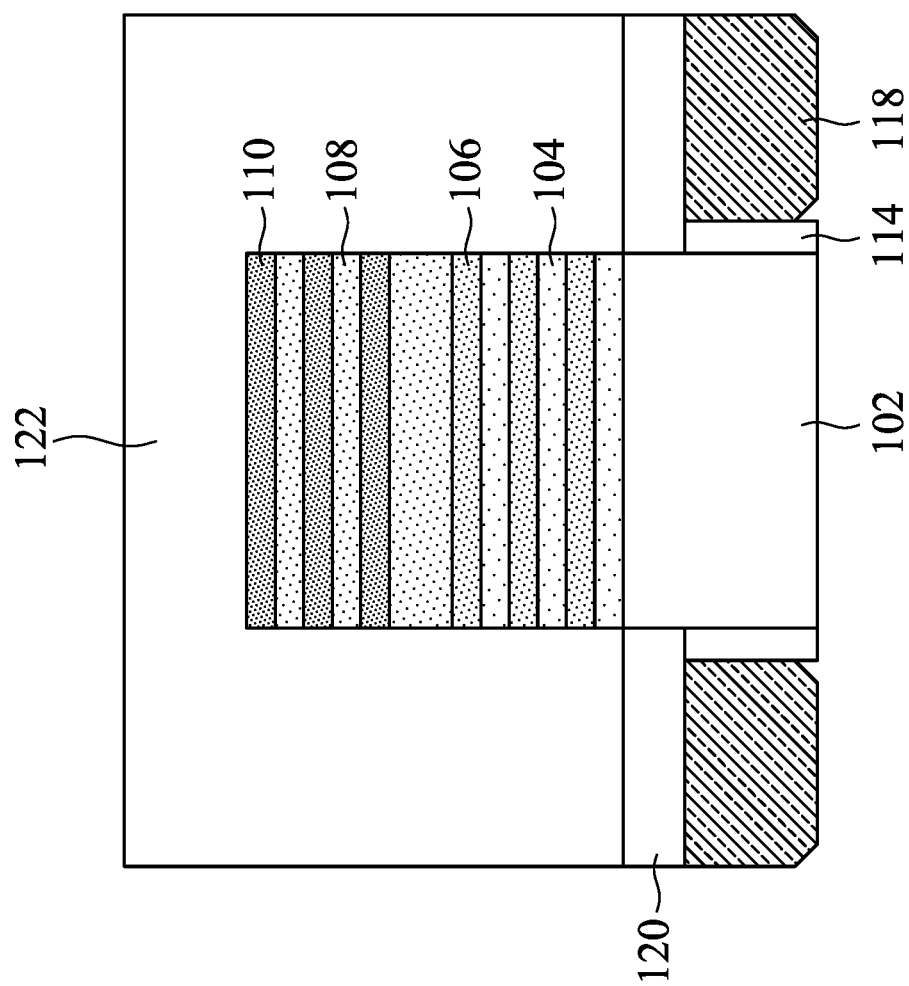
Figures 2, 2G, 3:
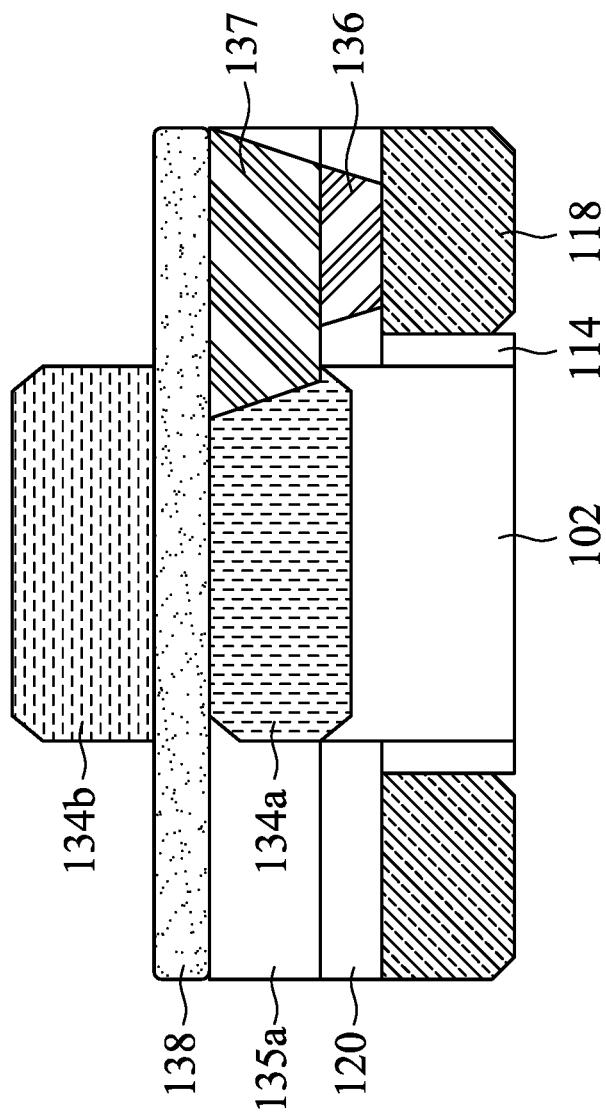

After the first source/drain epitaxial structures 134a is formed, a first inter-layer dielectric (ILD) structure 135a is formed over the etch stop layer 139, as shown in FIG. 2G-3 in accordance with some embodiments. The first ILD structure 135a may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, phosphosilicate glass (PSG), borophosphosilicate glass (BPSG), low-k dielectric materials, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The first ILD structure 135a may be formed by chemical vapor deposition (CVD), spin-on coating, or other applicable processes.

Next, an opening is formed in the first ILD structure 135a, exposing the power rail 118 beside the substrate 102 (not shown). The opening can be formed in the first ILD structure 135a by a lithography process (e.g., coating the resist, soft baking, exposure, post-exposure baking, developing, other applicable processes, or a combination thereof), an etching process (e.g., wet etching process, dry etching process, other applicable processes, or a combination thereof), other applicable processes, or a combination thereof.

Next, a barrier layer may be conformally formed over the bottom surface and the sidewalls of the opening formed in the first ILD structure 135a (not shown). The barrier layer may be formed before filling the conductive material in the opening to prevent the conductive material from diffusing out. The barrier layer may also serve as an adhesive or glue layer. The material of the barrier layer may be TiN, Ti, other applicable materials, or a combination thereof. The barrier layer may be formed by depositing the barrier layer materials by a physical vapor deposition process (PVD) (e.g., evaporation or sputtering), an atomic layer deposition process (ALD), an electroplating process, other applicable processes, or a combination thereof.

Afterwards, a first contact structure 136 is formed into the opening in the first ILD structure 135a, as shown in FIG. 2G-3 in accordance with some embodiments. The first contact structure 136 may be made of metal materials (e.g., Co, Ni, W, Ti, Ta, Cu, Al, Ru, Mo, TiN, TaN, and/or a combination thereof), metal alloys, poly-Si, other applicable conductive materials, or a combination thereof. The first contact structure 136 may be formed by a chemical vapor deposition process (CVD), a physical vapor deposition process (PVD), (e.g., evaporation or sputter), an atomic layer deposition process (ALD), an electroplating process, another suitable process, or a combination thereof to deposit the conductive materials of the first contact structure 136, and then an etch back process is optionally performed to remove excess conductive materials.

Next, an opening is formed in the in the first ILD structure 135a, exposing the first contact structure 136 and the sidewall of the first source/drain epitaxial structures 134a (not shown). The processes for forming the opening may be the same as, or similar to, those used to form the opening for forming the first contact structure 136. For the purpose of brevity, the descriptions of these processes are not repeated herein.

Next, a metal semiconductor compound layer may be formed over the sidewall of the first source/drain epitaxial structure 134a (not shown). The metal semiconductor compound layer may reduce the contact resistance between the first source/drain epitaxial structure 134a and the subsequently formed metallization structure over the first source/drain epitaxial structure 134a. The metal semiconductor compound layer may be made of titanium silicide ($TiSi_2$), nickel silicide (NiSi), cobalt silicide (CoSi), or other suitable low-resistance materials. The metal semiconductor compound layer may be formed over the first source/drain epitaxial structure 134a by forming a metal layer over the first source/drain epitaxial structure 134a first. The metal layer may react with the first source/drain epitaxial structure 134a in an annealing process and a metal semiconductor compound layer may be produced. Afterwards, the unreacted metal layer may be removed in an etching process and the metal semiconductor compound layer may be left.

Afterwards, a second contact structure 137 is formed in the opening exposing the first contact structure 136 and the sidewall of the first source/drain epitaxial structures 134a, as shown in FIG. 2G-3 in accordance with some embodiments. The processes and materials for forming the second contact structure 137 may be the same as, or similar to, those used to form the first contact structure 136. For the purpose of brevity, the descriptions of these processes are not repeated herein. With the first contact structure 136 and the second contact structure 137, the first source/drain epitaxial structures 134a may be electrically connect to the power rail 118.

After forming the first source/drain epitaxial structure 134a, the protection layer 132 is removed, as shown in FIGS. 2G-1 and 2G-2 in accordance with some embodiments. The sidewalls of the first semiconductor stack 101 may be exposed. The protection layer 132 may be removed by a dry etching process or a wet etching process. The dry etching process may be performed by an oxygen-containing gas, a fluorine-containing gas (such as $CF_4$, $SF_6$, $CH_2F_2$, $CHF_3$, and/or $C2F_6$), a chlorine-containing gas (such as $Cl_2$, $CHCl_3$, $CCl_4$, and/or $BCl_3$), bromine-containing gas (such as HBr and/or $CHBR_3$), iodine-containing gas, other suitable gas and/or plasma, or a combination thereof. The wet etching process may be performed in wet etching etchant including diluted hydrofluoric acid (DHF), potassium hydroxide (KOH), ammonia, hydrofluoric acid (HF), nitric acid ($HNO_3$), and/or acetic acid ($CH_3COOH$), other suitable wet etching etchant, or a combination thereof.

Next, an insulating layer 138 is formed over the first source/drain epitaxial structure 134a, as shown in FIG. 2G-1 in accordance with some embodiments. As shown in FIG. 2G-1, the insulating layer 138 formed over the sidewall of the inner spacer 130b beside the bottommost third semiconductor layer 108. The insulating layer 138 may be formed beside the boundary between the first semiconductor stack 101 and the second semiconductor stack 107. The insulating layer 138 provides insulation between the first source/drain epitaxial structure 134a and subsequently formed source/drain epitaxial structure. The insulating layer 138 may be made of silicon oxide, silicon nitride, silicon oxynitride, other applicable materials, or a combination thereof. The insulating layer 138 may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

Next, a second source/drain epitaxial structure 134b is formed in the source/drain opening 126 over the insulating layer 138, as shown in FIGS. 2G-1 and 2G-3 in accordance with some embodiments. As shown in FIG. 2G-1, the second source/drain epitaxial structure 134b is formed over opposite sides of the top portion of the fin structure 112. The second source/drain epitaxial structure 134b may be grown beside the second semiconductor stack 107. The second source/drain epitaxial structure 134b may be grown beside the third semiconductor layers 108 and the fourth semiconductor layers 110. The second source/drain epitaxial structure 134b may be grown over the sidewalls of the fourth semiconductor layers 110 and the second inner spacer 130b.

In some embodiments, second source/drain epitaxial structure 134b has a second conductivity type. The second conductivity type may be different from the first conductivity type. The first conductivity type may be N-type. In some embodiments, the first source/drain epitaxial structure 134a and the second source/drain epitaxial structure 134b have different conductivity types.

A strained material may be grown in the source/drain opening 126 by an epitaxial (epi) process to form the second source/drain epitaxial structure 134b. In addition, the lattice constant of the strained material may be different from the lattice constant of the insulating layer 138. The second source/drain epitaxial structure 134b may include SiC, SiP, Ge, SiGe, InAs, InGaAs, InSb, GaAs, GaSb, InAlP, InP, other applicable materials, or a combination thereof. The processes for forming the second source/drain epitaxial structure 134b may be the same as, or similar to, those used to form the first source/drain epitaxial structure 134a. For the purpose of brevity, the descriptions of these processes are not repeated herein. The second source/drain epitaxial structure 134b may be doped with one or more dopants. For example, the second source/drain epitaxial structure 134b may be P, As, or another applicable dopant.

Next, an etch stop layer 139 is formed over the second source/drain epitaxial structure 134b, as shown in FIGS. 2H-1 and 2H-3 in accordance with some embodiments. The etch stop layer 139 may include silicon nitride, silicon oxide, silicon oxynitride (SiON), silicon oxide carbonitride (SiOCN), low-k dielectric materials, other applicable materials, or a combination thereof. The etch stop layer 139 may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

After the etch stop layer 139 is formed, a second interlayer dielectric (ILD) structure 135b is formed over the etch stop layer 139, as shown in FIGS. 2H-1 and 2H-3 in accordance with some embodiments. The processes and the materials for forming the second ILD structure 135b may be the same as, or similar to, those used to form the first ILD structure 135a. For the purpose of brevity, the descriptions of these processes are not repeated herein.

Afterwards, a planarizing process is performed on the second ILD structure 135b until the top surface of the dummy gate structure 122 is exposed (not shown). After the planarizing process, the top surface of the dummy gate structure 122 may be substantially level with the top surfaces of the spacer layers 124 and the second ILD structure 135b. The planarizing process may include a grinding process, a chemical mechanical polishing (CMP) process, an etching process, other applicable processes, or a combination thereof.

Next, the dummy gate structure 122 including the dummy gate dielectric layer and a dummy gate electrode layer is removed (not shown). Therefore, a trench is formed between the spacer layers 124 over the fin structure 112. The dummy gate structure 122 may be removed by a dry etching process or a wet etching process.

While removing the dummy gate structure 122, the first semiconductor layers 104 and the third semiconductor layers 108 are also removed to form gaps between the first inner spacer 130a and the second spacer 130b, respectively (not shown). The removal process may include a selective etching process. The selective etching process may remove the first semiconductor layers 104 and the third semiconductor layers 108 and remain the second semiconductor layers 106 and the fourth semiconductor layers 110 as the first nanostructure 106 and the second nanostructure 110 as channel regions respectively, in accordance with some embodiments.

The selective etching process of removing the first semiconductor layers 104 and the third semiconductor layers 108 may include a wet etch process, a dry etch process, or a combination thereof. The etchant of the dry chemical etching process may include radicals such as HF, $F_2$, or a combination thereof. In some embodiments, the ratio of HF and $F_2$ are in a range of about 0.1 to about 0.9. If the ratio is too high, the second semiconductor layers 106 may be over etched, which may result in a thin and narrow channel region. If the ratio is too low, the third semiconductor layers 108 may be under etched, which may lead to worse gate control to the fourth semiconductor layers 110. In some embodiments, the first semiconductor layers 104 and the third semiconductor layers 108 are removed under a temperature of about 10° C. to about 70° C. In some embodiments, the first semiconductor layers 104 and the third semiconductor layers 108 are removed in about 50 seconds to about 120 seconds. If the temperature is too high and the duration is too long, the second semiconductor layers 106 may be over etched, which may result in a thin and narrow channel region. If the temperature is too low and the duration is too short, the third semiconductor layers 108 may be under etched, which may lead to worse gate control to the fourth semiconductor layers 110.

Figures 1, 2H:
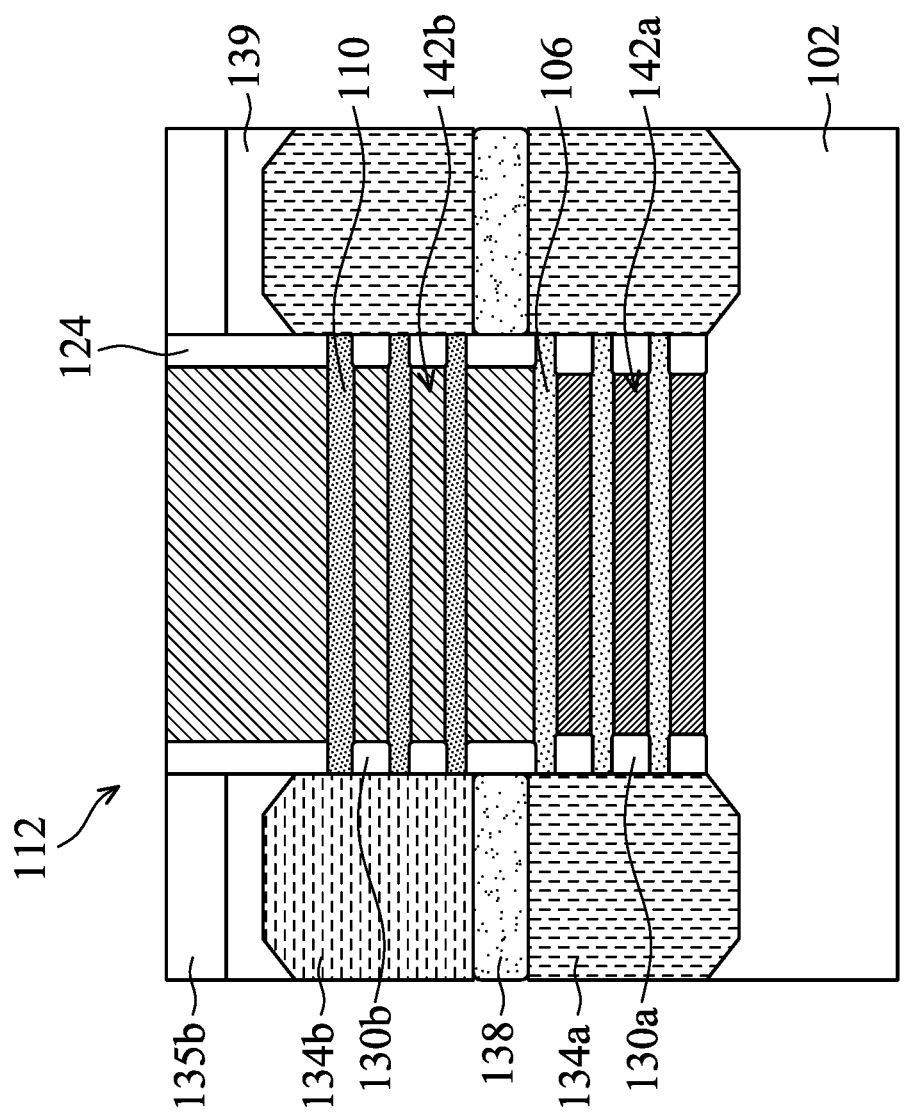
Figures 2, 2H:
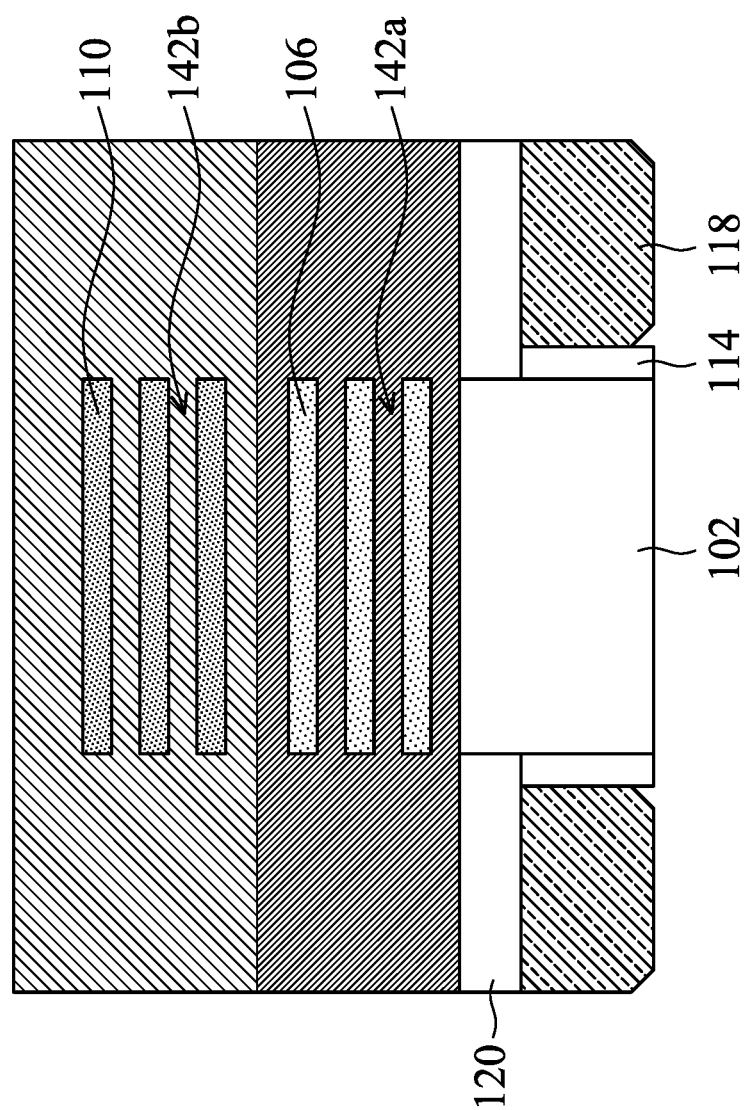
Figures 2, 2H, 3:
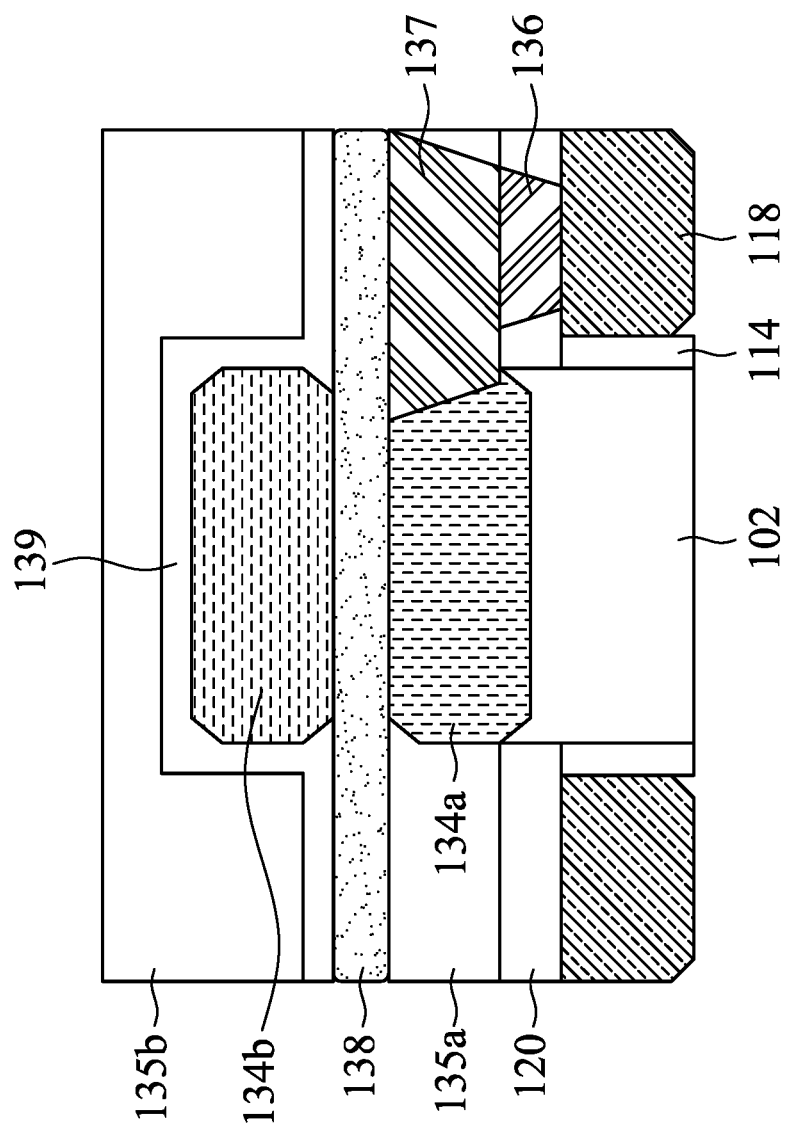

After the gaps between the first inner spacer 130a and the second spacer 130b are formed, a protection layer may be formed covering the second nanostructure 110 (not shown). Later, first gate structures 142a are formed surrounding the first nanostructure 106, as shown in FIGS. 2H-1 and 2H-2 in accordance with some embodiments. Therefore, the gate control ability may be enhanced.

Figure 4:
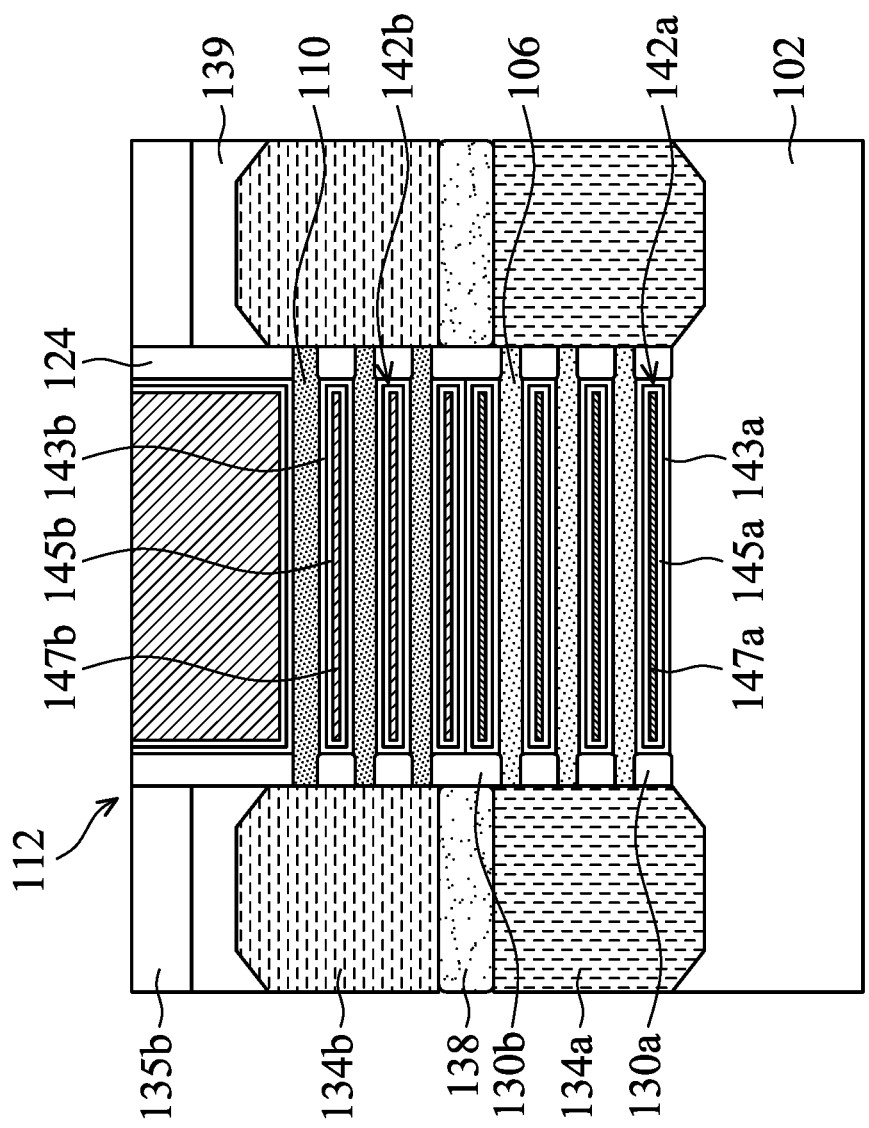
FIG. 4 is an enlarged cross-sectional representation of a semiconductor device structure, in accordance with some embodiments of the disclosure.

FIG. 4 is an enlarged cross-sectional representation of a semiconductor device structure as shown in FIG. 2H-1, in accordance with some embodiments of the disclosure. As shown in FIG. 4, the first gate structures 142a are multi-layered structures. Each of the first gate structures 142a may include a first interfacial layer 143a, a first high-k dielectric layer 145a, a first work function layer 147a, and a first gate electrode layer (not shown). The first nanostructure 106 may be surrounded and in direct contact with the first interfacial layers 143a, and the first interfacial layers 143a may be surrounded by the first high-k dielectric layers 145a. In addition, the high-k dielectric layers 145a may be surrounded by the first work function layer 147a, and the first work function layer 147a may be surrounded by the gate electrode layer.

The first interfacial layers 143a may be made of silicon oxide, and the interfacial layers may be formed by thermal oxidation. The first high-k dielectric layer 145a may include dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other applicable high-k dielectric materials, or a combination thereof. The first high-k dielectric layers 145a may be formed by using CVD, ALD, other applicable methods, or a combination thereof.

The first work function layers 147a may be made of metal materials. In some embodiments, the metal materials of the first gate structures 142a include P-work-function metal. The P-work-function metal may include titanium nitride (TiN), tungsten nitride (WN), tantalum nitride (TaN), ruthenium (Ru) or a combination thereof. The first work function layers 147a may be formed by using CVD, ALD, other applicable methods, or a combination thereof.

The gate electrode layers may be made of one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another applicable material, or a combination thereof. The gate electrode layers may be formed by using CVD, ALD, electroplating, another applicable method, or a combination thereof.

Next, the protection layer covering the second nanostructure 110 may be removed, and the second gate structures 142b are formed surrounding the second nanostructure 110, as shown in FIGS. 2H-1, 2H-2 in accordance with some embodiments. As shown in FIG. 4, each of the second gate structures 142b may include a second interfacial layer 143b, a second high-k dielectric layer 145b, a second work function layer 147b, and a second gate electrode layer (not shown). The structure and processes materials for forming the second interfacial layer 143b, the second high-k dielectric layer 145b, the second work function layer 147b, and the second gate electrode layer may be the same as, or similar to, those used to form the first interfacial layer 143a, the first high-k dielectric layer 145a, the first work function layer 147a, and the first gate electrode layer. For the purpose of brevity, the descriptions of these processes are not repeated herein. The difference between the first gate structures 142a and the second gate structures 142b is that, the first gate structures 142a and the second gate structures 142b have different conductivity types.

In some embodiments, the metal materials of the second work function layer 147b include N-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof.

It should be noted that, although in the previous description, the first gate structures 142a is formed first and the second gate structures 142b is formed later, the second gate structures 142b may also be formed first and the first gate structures 142a is formed later, depending on the demands of the manufacturing process.

As shown in FIGS. 2H-1 and 4, the boundary between the first gate structures 142a and the second gate structures 142b is higher than the bottom surface of the insulating layer 138 and lower than the top surface of the insulating layer 138.

Figures 1, 2I:
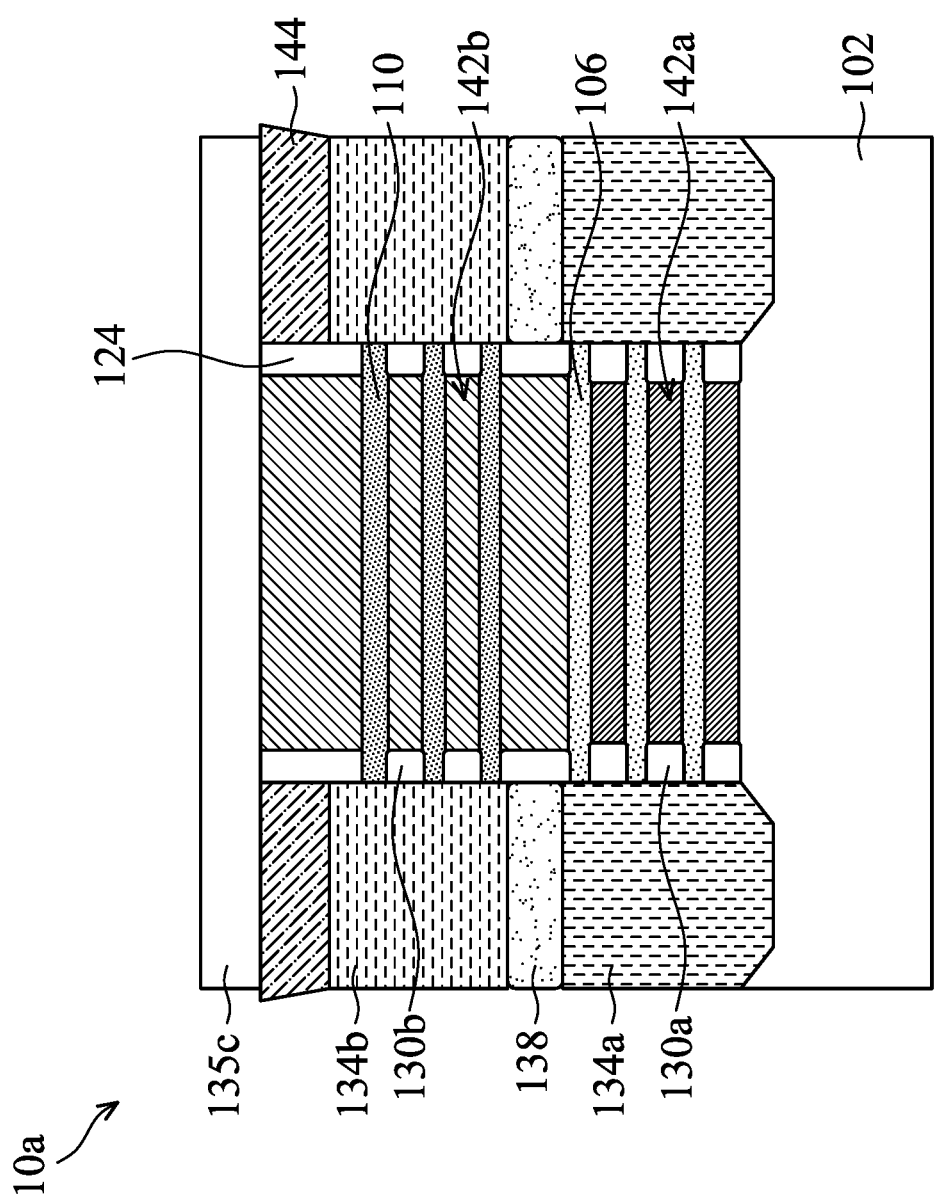
Figures 2, 2I:
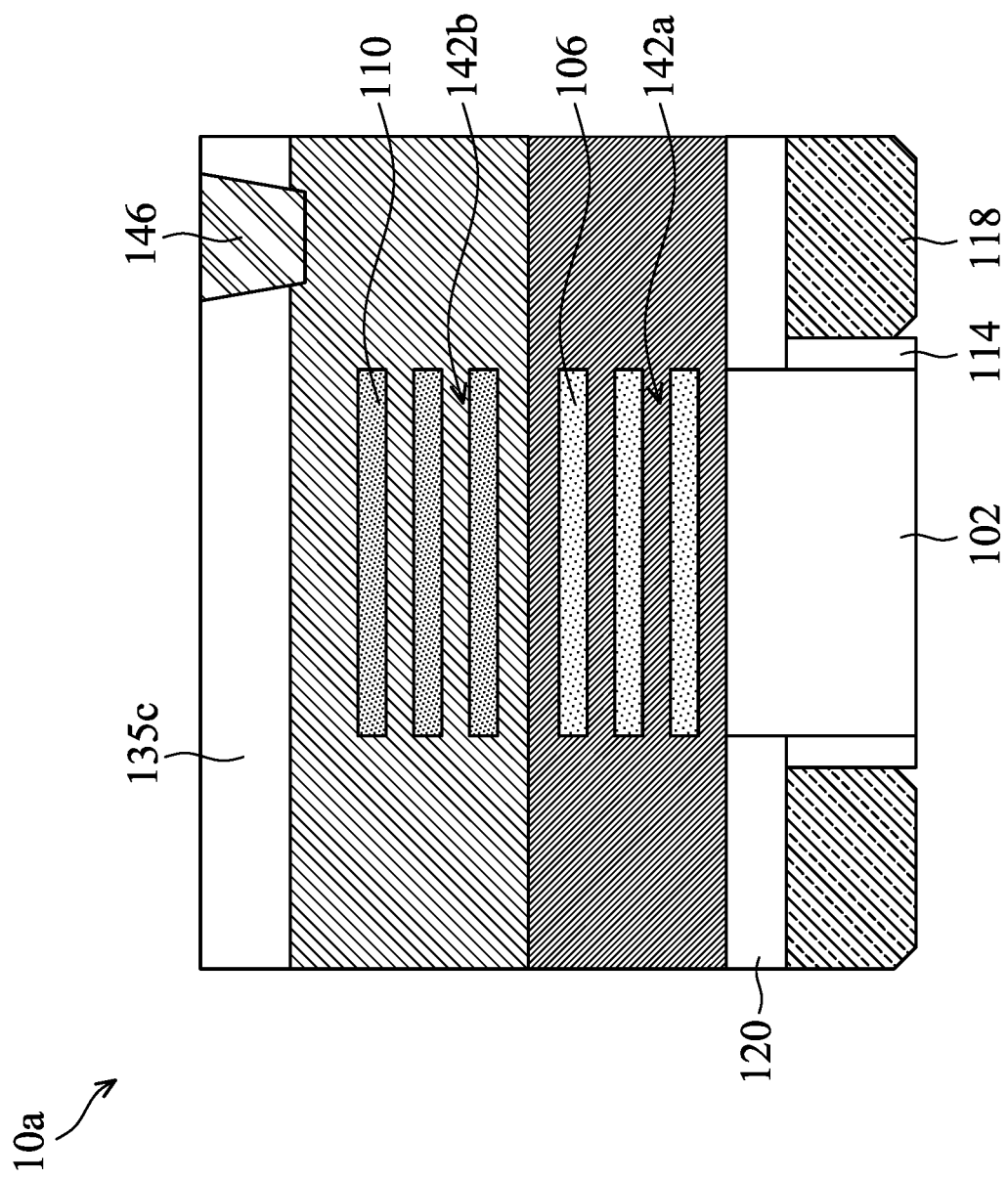
Figures 2, 2I, 3:
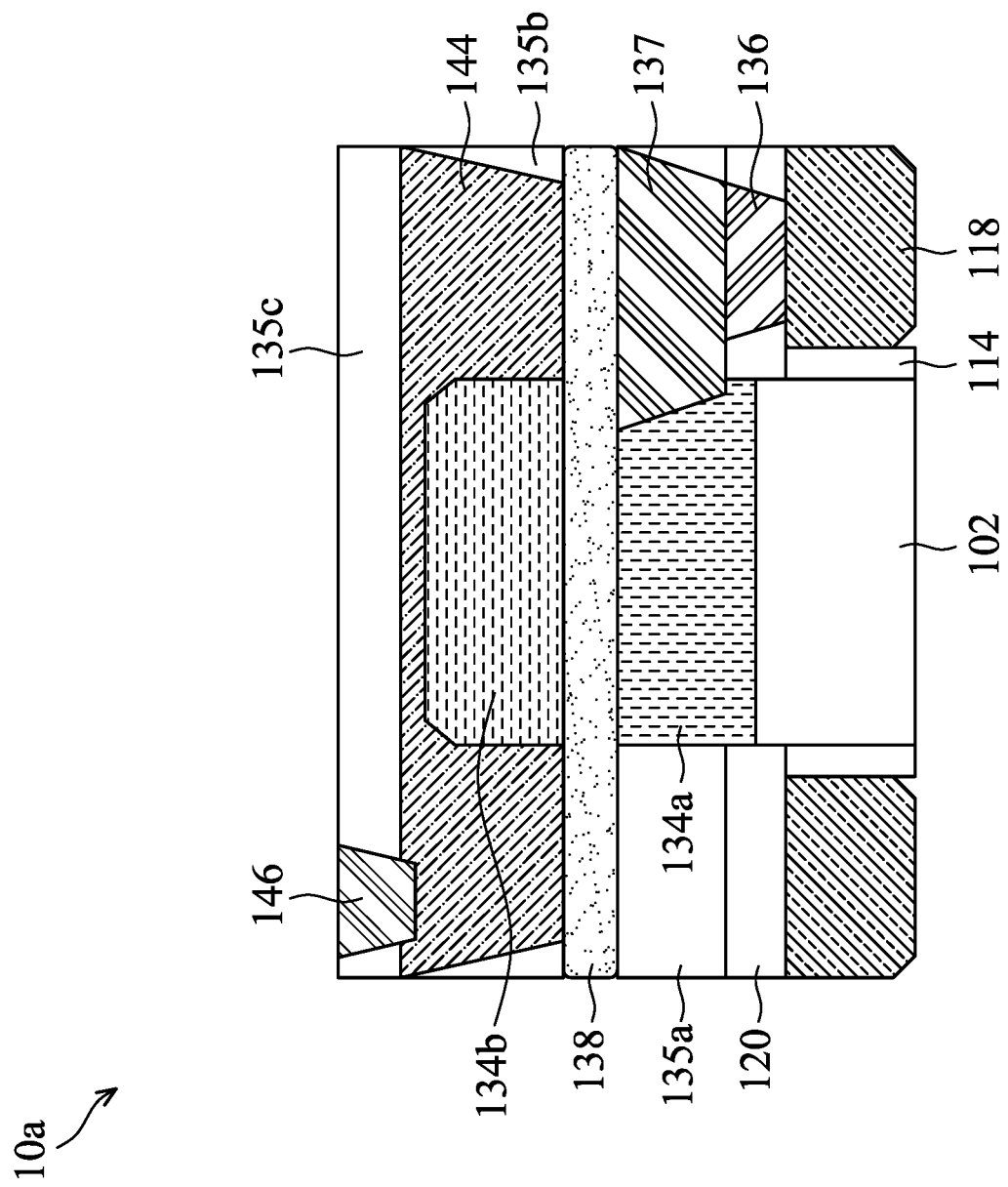
Figure 3:
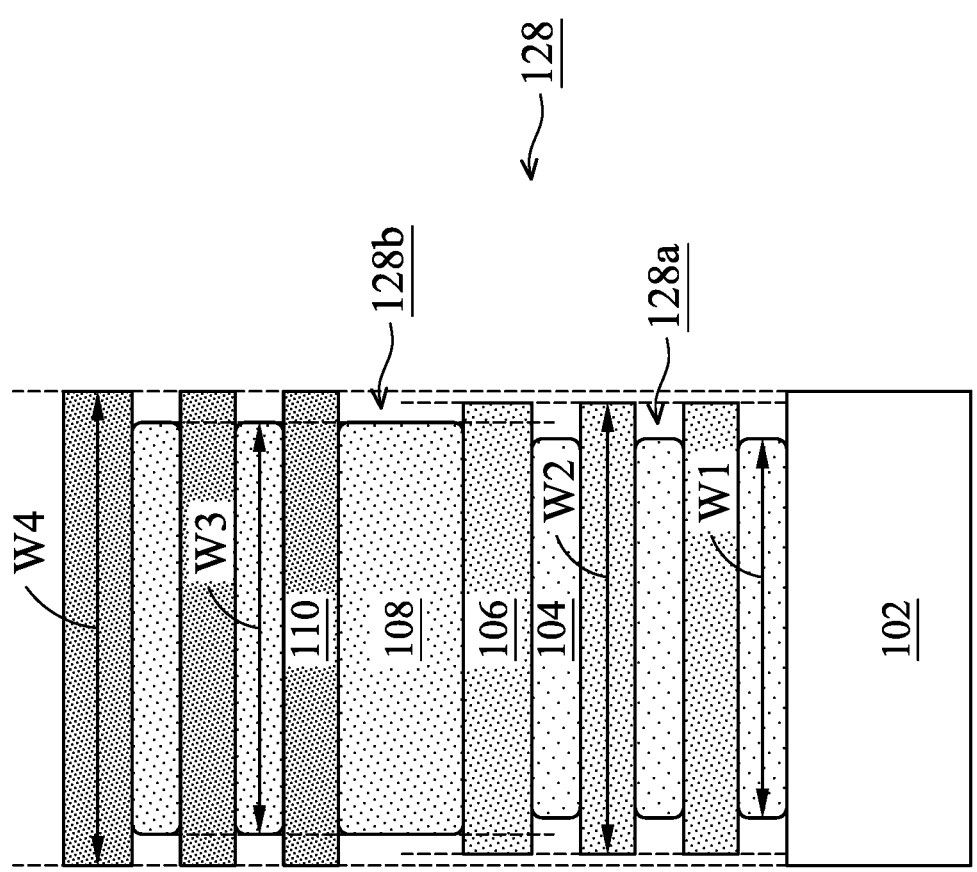

Next, an opening is formed in the second ILD structure 135b and the etch stop layer 139 exposing the second source/drain epitaxial structure 134b (not shown). Afterwards, a third contact structure 144 is formed in the opening, as shown in FIGS. 2I-1 and 2I-3. The processes and the materials for forming the third contact structure 144 may be the same as, or similar to, those used to form the second contact structure 137. For the purpose of brevity, the descriptions of these processes are not repeated herein. As shown in FIG. 2I-3, the third contact structure 144 wraps around the top surface and the sidewall of the second source/drain epitaxial structure 134b.

Next, a third ILD structure 135c is formed over the third contact structure 144, and a fourth contact structure 146 is formed in the third ILD structure 135c electrically connected to the third contact structure 144 or the second gate structures 142b, as shown in FIGS. 2I-1 to 2I-3. The processes and the materials for forming the third ILD structure 135c and the fourth contact structure 146 may be the same as, or similar to, those used to form the second ILD structure 135b and the third contact structure 144. For the purpose of brevity, the descriptions of these processes are not repeated herein.

By stacking the first nanostructure 106 and the second nanostructure 110 of different conductivity type with power rails 118 formed beside, the cell height may be reduced. With first nanostructure 106 made of SiGe as the channel region, the mobility of PFET device may be enhanced. The first nanostructure 106 and the second nanostructure 110 may be formed by stacking semiconductor layers with different Ge concentration. The etching selectivity may be different due to different Ge concentration. Therefore, the inner spacers 130a and 130b with different widths may be formed at the same time, and the first nanostructure 106 and the second nanostructure 110 may be formed at the same time. The cost and time required for production may be reduced.

Figure 5A:
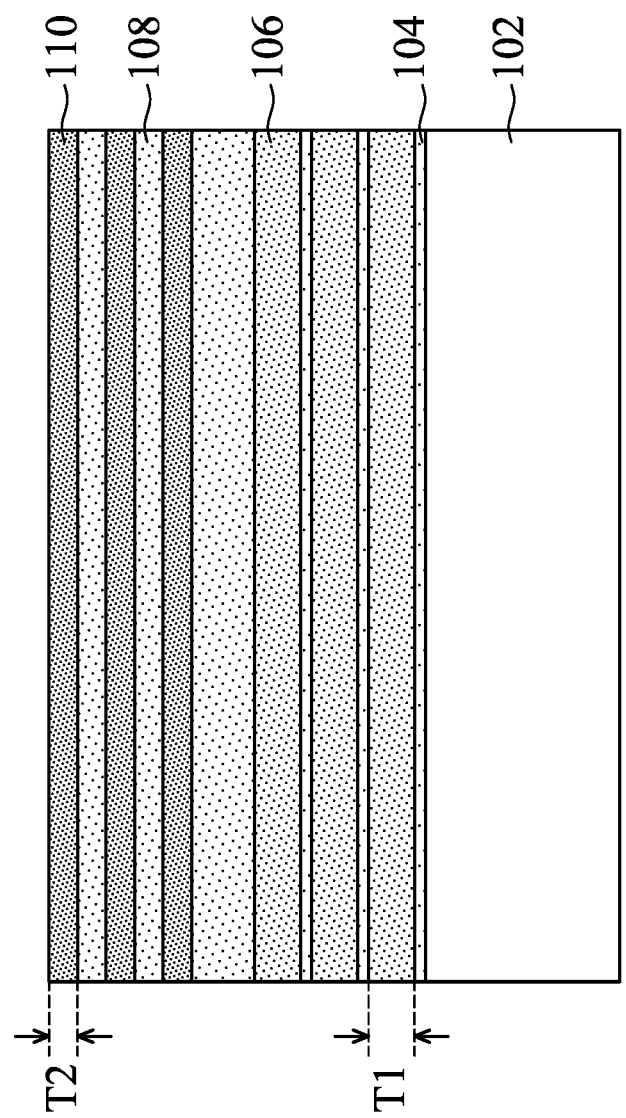
FIGS. 5A-5B are cross-sectional representations of various stages of forming a modified semiconductor device structure, in accordance with some embodiments of the disclosure.
Figure 5B:
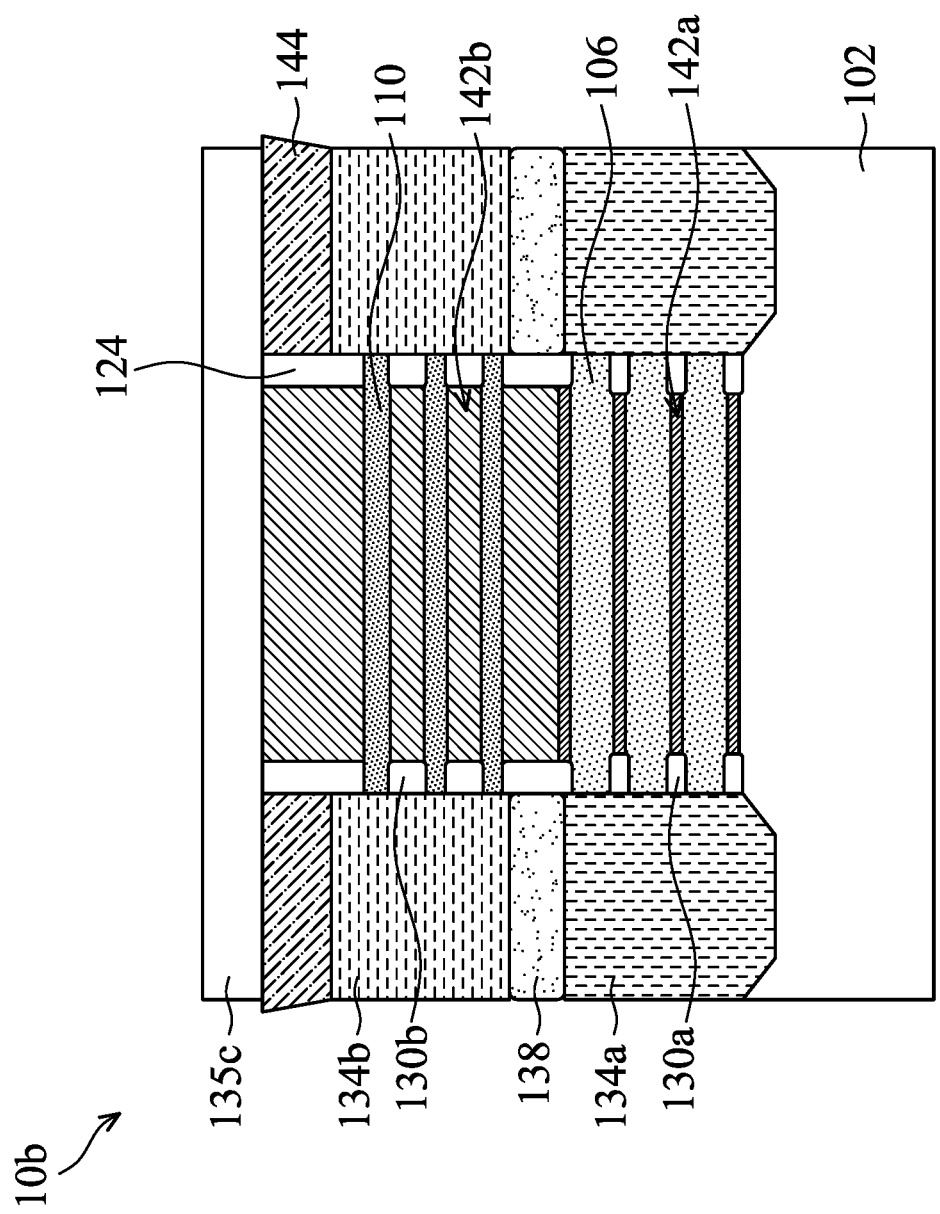

Many variations and/or modifications may be made to the embodiments of the disclosure. FIGS. 5A-5B are cross-sectional representations of various stages of forming a semiconductor device structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 5A in accordance with some embodiments, the second semiconductor layers 106 and the fourth semiconductor layers 110 have different thicknesses.

As shown in FIG. 5A, the second semiconductor layers 106 has a thickness of T1, and the fourth semiconductor layers 110 has a thickness of T2. In some embodiments, thickness T1 is greater than thickness T2. Since the Ge concentration of the second semiconductor layers 106 is higher than the Ge concentration of the fourth semiconductor layers 110, the second semiconductor layers 106 may be consumed more during the lateral etching process and the nanostructure 106 forming process. Therefore, thicker second semiconductor layers 106 may be more durable in the subsequently etching process. As shown in FIG. 5B, the resulting first nanostructures 106 and second nanostructures 110 have different thicknesses after the nanostructure 106 forming process. In some embodiments, the first nanostructures 106 is thicker than the second nanostructures 110.

By stacking the first nanostructure 106 and the second nanostructure 110 of different conductivity type with power rails 118 formed beside, the cell height may be reduced. With first nanostructure 106 made of SiGe as the channel region, the mobility of PFET device may be enhanced. The first nanostructure 106 and the second nanostructure 110 may be formed by stacking semiconductor layers with different Ge concentration. The etching selectivity may be different due to different Ge concentration. Therefore, the inner spacers 130a and 130b with different widths may be formed at the same time, and the first nanostructure 106 and the second nanostructure 110 may be formed at the same time. The cost and time required for production may be reduced. The first nanostructure 106 and the second nanostructures 110 may have different thickness before and after the etching process.

Many variations and/or modifications may be made to the embodiments of the disclosure. FIGS. 6A-6F are cross-sectional representations of various stages of forming a semiconductor device structure 10c, in accordance with some embodiments of the disclosure. Some processes or devices are the same as, or similar to, those described in these embodiments above, and therefore the descriptions of these processes and devices are not repeated herein. The difference from the embodiments described above is that, as shown in FIGS. 6A-6F in accordance with some embodiments, the first nanostructures 106 and the second nanostructures 110 are formed separately.

Figure 6A:
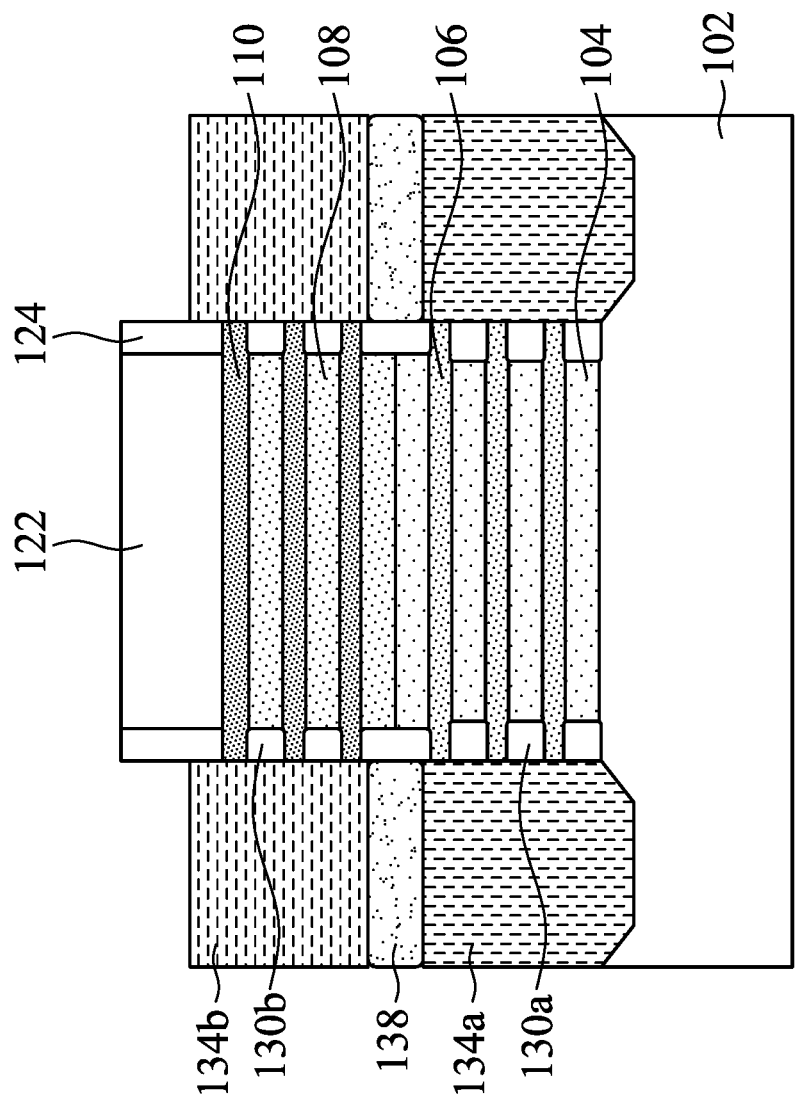
FIGS. 6A-6F are cross-sectional representations of various stages of forming a modified semiconductor device structure, in accordance with some embodiments of the disclosure.

As shown in FIG. 6A, the topmost first semiconductor layer 104 is over the topmost second semiconductor layer 106, and the bottommost third semiconductor layer 108 is under the bottommost fourth semiconductor layer 110.

It should be noted that, although there are four layers of first semiconductor layers 104 and four layers of second semiconductor layers 106 shown in FIG. 6A, the number of the first semiconductor layers 104 and second semiconductor layers 106 are not limited herein, depending on the demands of the manufacturing process and on performance requirements.

Figure 6B:
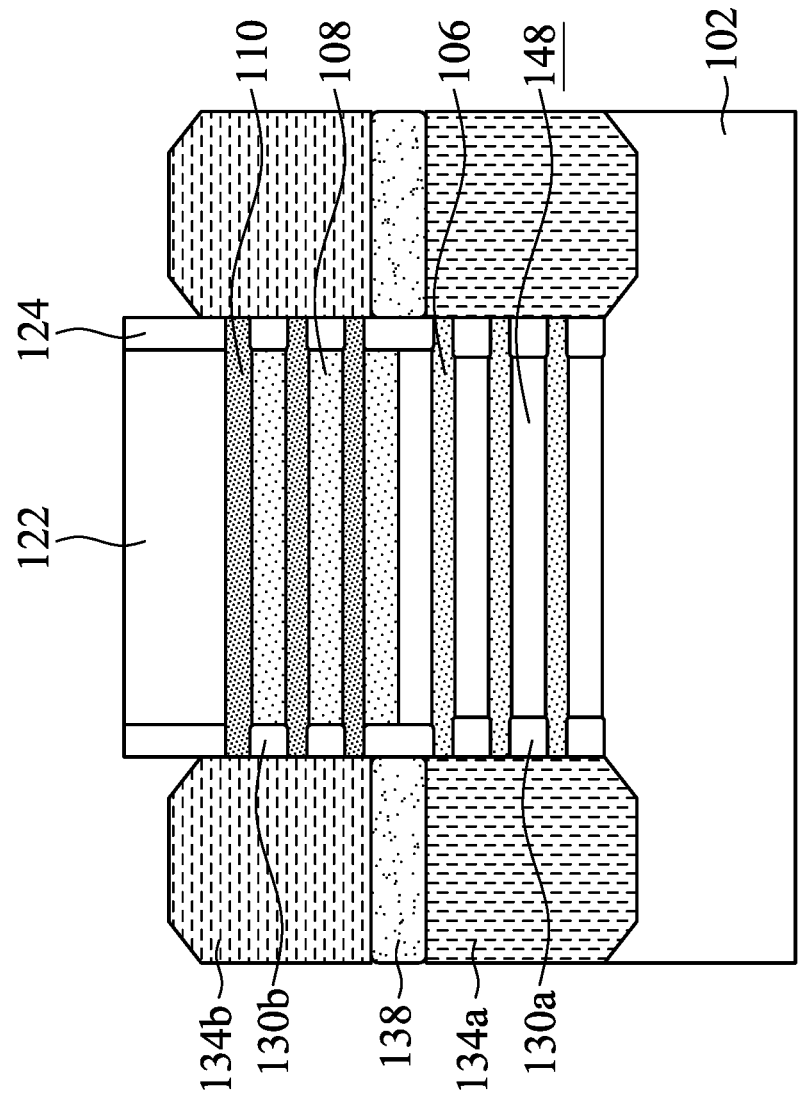

Afterwards, as shown in FIG. 6B, the first semiconductor layers 104 are removed to form gaps 148, and the first nanostructures 106 are formed between the first source/drain epitaxial structures 134a. The first semiconductor layers 104 may be removed by a selective etching process. The selective etching process of removing the first semiconductor layers 104 may include a wet etch process, a dry etch process, or a combination thereof. The etchant of the dry chemical etching process may include radicals such as HF, $F_2$, or a combination thereof. In some embodiments, the ratio of HF and F2 are in a range of about 1:2 to about 1:10. If the ratio is too high, the first nanostructures 106 may be too thin. If the ratio is too low, the first semiconductor layers 104 may be under etched. In some embodiments, the first semiconductor layers 104 are removed under a temperature of about 10° C. to about 70° C. In some embodiments, the first semiconductor layers 104 are removed in about 50 seconds to about 120 seconds. If the temperature is too high and the duration is too long, the first nanostructures 106 may be too thin. If the temperature is too low and the duration is too short, the first semiconductor layers 104 may be under etched.

Figure 6C:
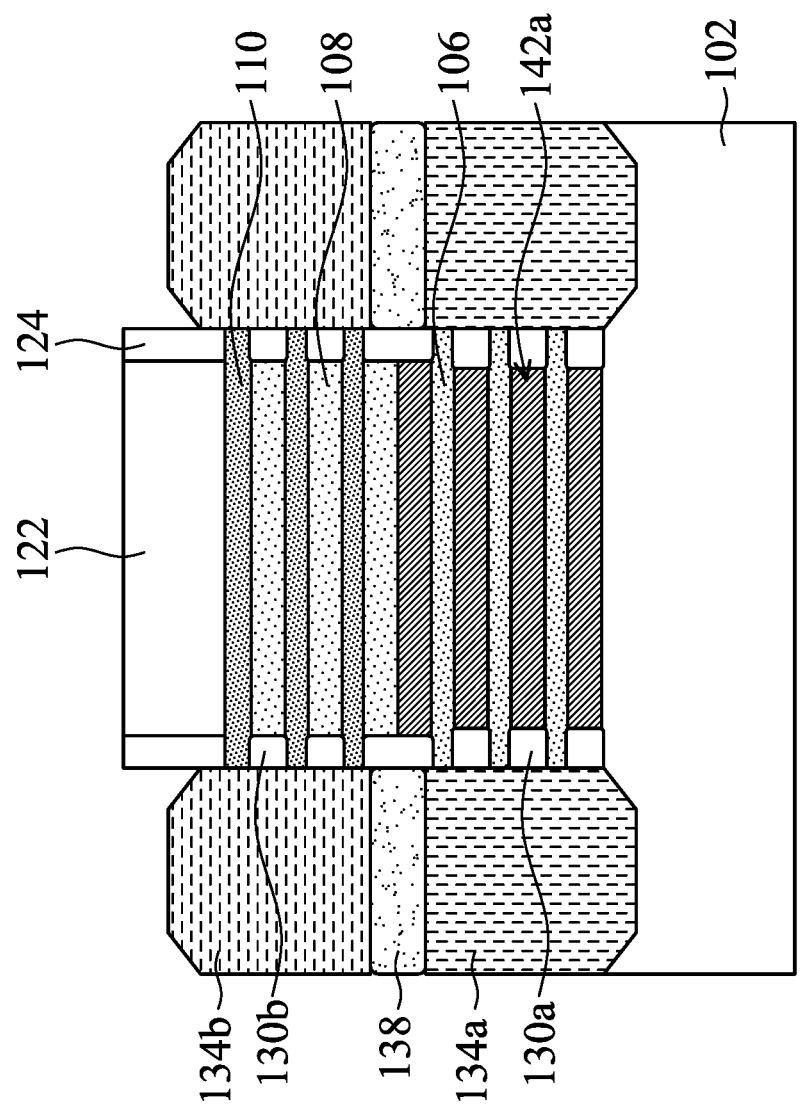

Next, as shown in FIG. 6C, a first gate structure 142a are formed surrounding the first nanostructure 106. The processes and materials for forming the first gate structure 142a may be the same as, or similar to, those used to form first gate structure 142a in the previous embodiments. For the purpose of brevity, the descriptions of these processes are not repeated herein.

Figure 6D:
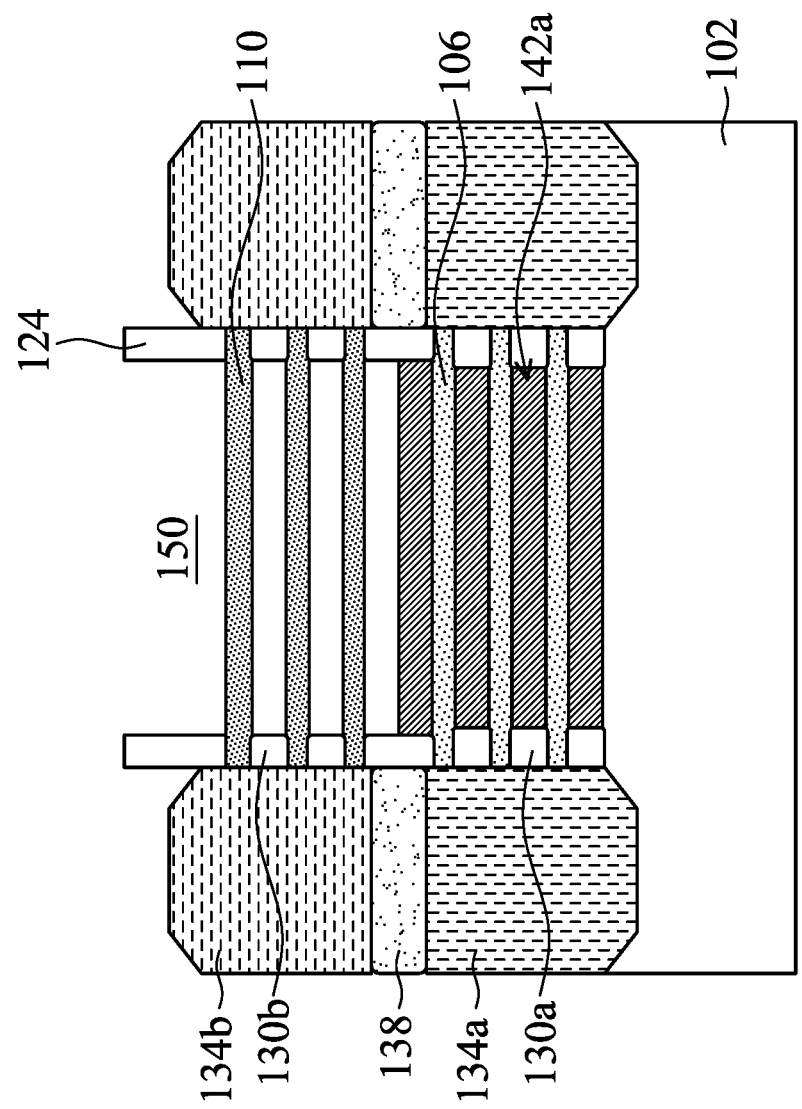

Afterwards, as shown in FIG. 6D, the dummy gate structure 122 and the third semiconductor layers 108 are removed to form gaps 150, and the second nanostructure 110 are formed between the second source/drain epitaxial structures 134b. The dummy gate structure 122 and the third semiconductor layers 108 may be removed by a selective etching process. The selective etching process of removing the dummy gate structure 122 and the third semiconductor layers 108 may include a wet etch process, a dry etch process, or a combination thereof. The etchant of the dry chemical etching process may include radicals such as HF, $F_2$, or a combination thereof. In some embodiments, the ratio of HF and F2 are in a range of about 1:1 to about 1:4. If the ratio is too high, the second nanostructures 110 may be too thin. If the ratio is too low, the third semiconductor layers 108 may be under etched. In some embodiments, the dummy gate structure 122 and the third semiconductor layers 108 are removed under a temperature of about 10° C. to about 70° C. In some embodiments, the dummy gate structure 122 and the third semiconductor layers 108 are removed in about 50 seconds to about 120 seconds. If the temperature is too high and the duration is too long, the second nanostructures 110 may be too thin. If the temperature is too low and the duration is too short, the third semiconductor layers 108 may be under etched.

Figure 6E:
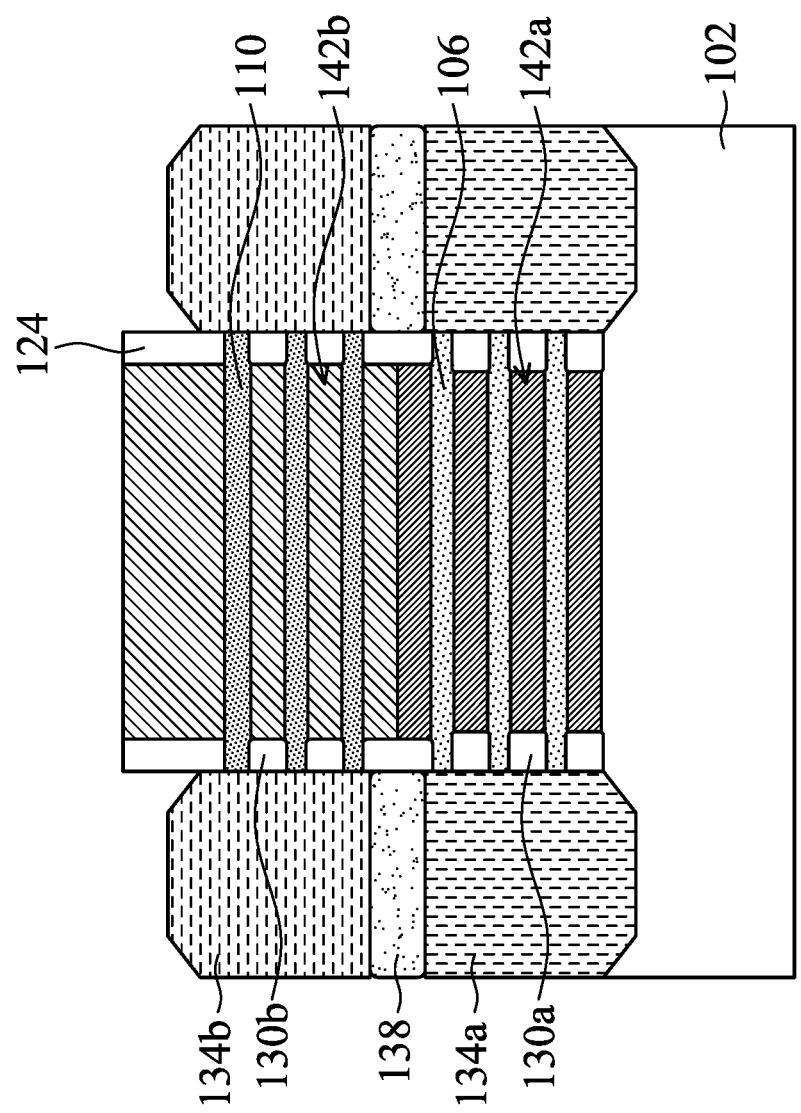
Figure 6F:
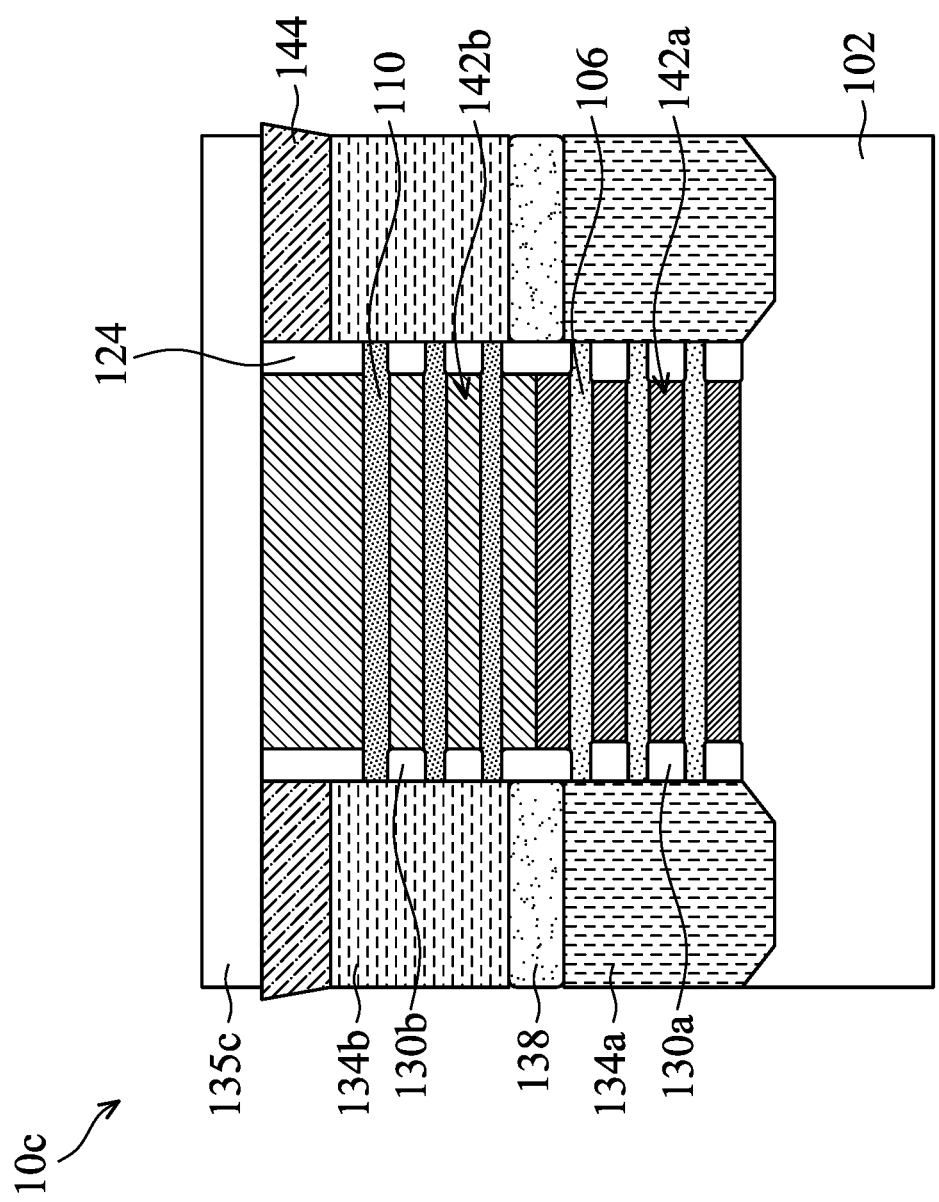

Next, as shown in FIG. 6E, a second gate structure 142b are formed surrounding the second nanostructure 110. The processes and materials for forming the second gate structure 142b may be the same as, or similar to, those used to form second gate structure 142b in the previous embodiments. For the purpose of brevity, the descriptions of these processes are not repeated herein.

As shown in FIGS. 6A-6F, the first nanostructures 106 and the second nanostructures 110 are formed separately. The third semiconductor layers 108 may be removed after forming the first gate structure 142b. Therefore, the thicknesses of the first nanostructures 106 and the second nanostructures 110 may more precisely and the process window of the removal of first semiconductor layers 104 and the third semiconductor layers 108 is greater.

It should be noted that, although in the previous description, the first semiconductor layers 104 may be removed first and the third semiconductor layers 108 may be removed later, the third semiconductor layers 108 may also be removed first and the first semiconductor layers 104 may be formed later, depending on the demands of the manufacturing process.

By stacking the first nanostructure 106 and the second nanostructure 110 of different conductivity type with power rails 118 formed beside, the cell height may be reduced. With first nanostructure 106 made of SiGe as the channel region, the mobility of PFET device may be enhanced. The first nanostructure 106 and the second nanostructure 110 may be formed by stacking semiconductor layers with different Ge concentration. The etching selectivity may be different due to different Ge concentration. Therefore, the inner spacers 130a and 130b with different widths may be formed at the same time, and the first nanostructure 106 and the second nanostructure 110 may be formed at the same time. The cost and time required for production may be reduced. With the first nanostructures 106 and the second nanostructures 110 formed separately, the thicknesses of the first nanostructures 106 and the second nanostructures 110 may be more precise.

Figure 7:
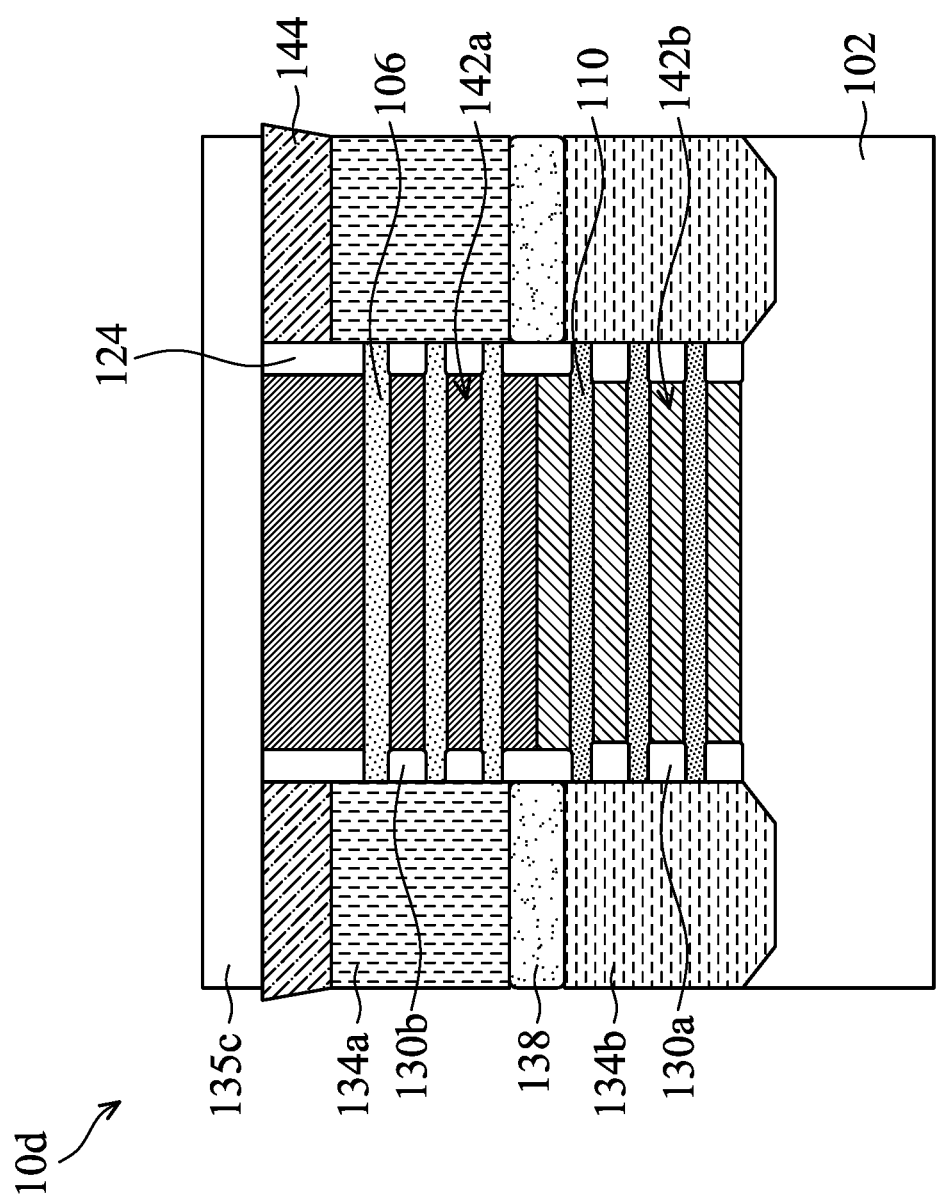
FIG. 7 is a cross-sectional representation of a semiconductor device structure, in accordance with some embodiments of the disclosure.

Many variations and/or modifications may be made to the embodiments of the disclosure. FIG. 7 is a cross-sectional representation of semiconductor device structure 10d, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 7 in accordance with some embodiments, the first nanostructures 106 is over the second nanostructures 110.

As shown in FIG. 7, the second source/drain epitaxial structures 134b is formed first, and the first source/drain epitaxial structures 134a is formed over the second source/drain epitaxial structures 134b. In addition, the first nanostructures 106 are formed over the second nanostructures 110. In some embodiments, the first source/drain epitaxial structures 134a and the first nanostructures 106 are P-type, and the second source/drain epitaxial structures 134b and the second nanostructures 110 are N-type. In some embodiments, the first nanostructures 106 include SiGe.

By stacking the first nanostructure 106 and the second nanostructure 110 of different conductivity type with power rails 118 formed beside, the cell height may be reduced. With first nanostructure 106 made of SiGe as the channel region, the mobility of PFET device may be enhanced. The first nanostructure 106 and the second nanostructure 110 may be formed by stacking semiconductor layers with different Ge concentration. The etching selectivity may be different due to different Ge concentration. Therefore, the inner spacers 130a and 130b with different widths may be formed at the same time, and the first nanostructure 106 and the second nanostructure 110 may be formed at the same time. The cost and time required for production may be reduced. P-type nanostructures 142a may also be formed over the N-type nanostructures 142b.

As described previously, the first nanostructures 106 and the second nanostructures 110 of different conductivity types may be stacked with each other, and power rails 118 are formed beside the nanostructures 106 and 108. The first nanostructure 106 may include SiGe, which may enhance PFET device mobility. With different Ge concentration of different semiconductor layers 104/106/108/110, the etching selectivity of different semiconductor layers 104/106/108/110 may be different, and the first nanostructure 106 and the second nanostructure 110 may be formed at the same time. Meanwhile, the first inner spacer 130a and the second inner spacer 130b may be formed at the same time. In some embodiments as shown in FIGS. 5A and 5B, the first nanostructure 106 and the second nanostructure 110 have different thicknesses. In some embodiments as shown in FIGS. 6A-6F, the first nanostructure 106 and the second nanostructure 110 are formed separately. In some embodiments as shown in FIG. 7, P-type nanostructure 106 is formed over the N-type nanostructures 110.

Embodiments of a semiconductor device structure and a method for forming the same are provided. The N-type and P-type nanostructures are stacked with each other between power rails. The P-type nanostructures include SiGe may enhance device mobility. By modifying the Ge concentration of the semiconductor layers, the etching selectivity of the semiconductor layers may be different, and the N-type and P-type nanostructures may be formed at the same time.

In some embodiments, a semiconductor device structure is provided. The semiconductor device structure includes first nanostructures formed over a substrate. The semiconductor device structure further includes a first gate structure wrapped around the first nanostructures. The semiconductor device structure further includes first source/drain epitaxial structures formed over opposite sides of the first nanostructures. The semiconductor device structure further includes second nanostructures formed over the first nanostructure. The semiconductor device structure further includes a second gate structure wrapped around the second nanostructures. The semiconductor device structure further includes second source/drain epitaxial structures formed over opposite sides of the second nanostructures. The first gate structure and the second gate structure have different conductivity types, and the Ge concentration of the first nanostructures is not the same as the Ge concentration of the second nanostructures.

In some embodiments, a semiconductor device structure is provided. The semiconductor device structure includes first nanostructures formed over a substrate. The semiconductor device structure further includes a first gate structure wrapped around the first nanostructures. The semiconductor device structure further includes a first inner spacer formed beside the first gate structure between the first nanostructures. The semiconductor device structure further includes a first source/drain epitaxial structure formed beside the first nanostructures. The semiconductor device structure further includes second nanostructures formed over the first nanostructures. The semiconductor device structure further includes a second gate structure wrapped around the second nanostructures. The semiconductor device structure further includes a second inner spacer formed beside the second gate structure between the second nanostructures. The semiconductor device structure further includes a second source/drain epitaxial structure formed beside the second nanostructures. The width of the first inner spacer is greater than the width of the second inner spacer.

In some embodiments, a method for forming a semiconductor device structure is provided. The method for forming a semiconductor device structure includes forming a first semiconductor stack with first semiconductor layers and second semiconductor layers alternately stacked over a substrate. The method for forming a semiconductor device structure also includes forming a second semiconductor stack with third semiconductor layers and fourth semiconductor layers alternately stacked over the first semiconductor stack. The method for forming a semiconductor device structure also includes laterally etching the first semiconductor layers to form first openings exposing sidewalls of the first semiconductor layers. The method for forming a semiconductor device structure also includes laterally etching the third semiconductor layers to form second openings exposing sidewalls of the third semiconductor layers. The method for forming a semiconductor device structure also includes forming first inner spacers in the first opening. The method for forming a semiconductor device structure also includes forming second inner spacers in the second opening. The method for forming a semiconductor device structure also includes removing the first semiconductor layers and the third semiconductor layers. The method for forming a semiconductor device structure also includes forming a first gate structure wrapped around the second semiconductor layers. The method for forming a semiconductor device structure also includes forming a second gate structure wrapped around the fourth semiconductor layers over the first gate structure. The Ge concentration of the second semiconductor layers is higher than the Ge concentration of the fourth semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   first nanostructures formed over a substrate;
   a first gate structure wrapped around the first nanostructures;
   first source/drain epitaxial structures formed over opposite sides of the first nanostructures;
   second nanostructures formed over the first nanostructure;
   a second gate structure wrapped around the second nanostructures;
   second source/drain epitaxial structures formed over opposite sides of the second nanostructures;
   a power rail formed below a bottom surface of the first source/drain epitaxial structures and electrically connected to the first source/drain epitaxial structures,
   a first inner spacer formed beside the first gate structure; and
   a second inner spacer formed beside the second gate structure,
   wherein the first inner spacer is wider than the second inner spacer;
   wherein the first gate structure and the second gate structure have different conductivity types, and a Ge concentration of the first nanostructures and a Ge concentration of the second nanostructures are different.

2. The semiconductor device structure as claimed in claim 1, wherein the Ge concentration of the first nanostructures is higher than the Ge concentration of the second nanostructures.

3. The semiconductor device structure as claimed in claim 1, wherein the first source/drain epitaxial structures have a first conductivity type, and the second source/drain epitaxial structures have a second conductivity type, wherein the first conductivity type and the second conductivity type are different.

4. The semiconductor device structure as claimed in claim 1, wherein a width of the first nanostructures is less than a width of the second nanostructures.

5. The semiconductor device structure as claimed in claim 1, wherein the first nanostructures comprise Si, and the second nanostructures comprise SiGe.

6. The semiconductor device structure as claimed in claim 1, further comprising:
   an insulating layer formed between the first source/drain epitaxial structures and the second source/drain epitaxial structures; and
   a contact structure formed between the insulating layer and the power rail.

7. The semiconductor device structure as claimed in claim 6, wherein a boundary between the first gate structure and the second gate structure is higher than a bottom surface of the insulating layer and lower than a top surface of the insulating layer.

8. A semiconductor device structure, comprising:
   first nanostructures formed over a substrate;
   a first gate structure wrapped around the first nanostructures;
   a first inner spacer formed beside the first gate structure between the first nanostructures;
   a first source/drain epitaxial structure formed beside the first nanostructures;
   second nanostructures formed over the first nanostructures;
   a second gate structure wrapped around the second nanostructures;
   a second inner spacer formed beside the second gate structure between the second nanostructures;
   a second source/drain epitaxial structure formed beside the second nanostructures; and
   a power rail electrically connected to the first source/drain epitaxial structure, wherein a top surface of the power rail is lower than a bottommost surface of the first nanostructures,
   wherein a width of the first inner spacer is greater than a width of the second inner spacer, and a thickness of the first nanostructures is greater than a thickness of the second nanostructures.

9. The semiconductor device structure as claimed in claim 8, further comprising:
   an insulating layer formed between the first source/drain epitaxial structure and the second source/drain epitaxial structure.

10. The semiconductor device structure as claimed in claim 9, further comprising:
    a contact structure formed below the insulating layer electrically connected to the first source/drain epitaxial structure and the power rails.

11. The semiconductor device structure as claimed in claim 10, wherein the insulating layer is in contact with the contact structure.

12. The semiconductor device structure as claimed in claim 8, wherein the first nanostructures comprise SiGe, and the second nanostructures comprise Si.

13. A method for forming a semiconductor device structure, comprising:
    forming a first semiconductor stack with first semiconductor layers and second semiconductor layers alternately stacked over a substrate;
    forming a second semiconductor stack with third semiconductor layers and fourth semiconductor layers alternately stacked over the first semiconductor stack;

laterally etching the first semiconductor layers to form first openings exposing sidewalls of the first semiconductor layers;
laterally etching the third semiconductor layers to form second openings exposing sidewalls of the third semiconductor layers;
forming first inner spacers in the first opening;
forming second inner spacers in the second opening;
removing the first semiconductor layers and the third semiconductor layers;
forming a first gate structure wrapped around the second semiconductor layers;
forming a second gate structure wrapped around the fourth semiconductor layers over the first gate structure,
wherein a Ge concentration of the second semiconductor layers is higher than a Ge concentration of the fourth semiconductor layers, and a Ge concentration of the first semiconductor layers is higher than a Ge concentration of the third semiconductor layers.

14. The method for forming the semiconductor device structure as claimed in claim 13, wherein the Ge concentration of the first semiconductor layers and the Ge concentration of the third semiconductor layers are greater than the Ge concentration of the second semiconductor layers.

15. The method for forming the semiconductor device structure as claimed in claim 13, further comprising:
forming a power rail beside the substrate.

16. The method for forming the semiconductor device structure as claimed in claim 13, wherein an etching rate of the first semiconductor layers and an etching rate of the third semiconductor layers are greater than an etching rate of the second semiconductor layers while laterally etching the first semiconductor layers and the third semiconductor layers.

17. The method for forming the semiconductor device structure as claimed in claim 13, wherein the first semiconductor layers and the third semiconductor layers are removed by a chemical comprising HF, $F_2$, or a combination thereof.

18. The method for forming the semiconductor device structure as claimed in claim 13, wherein the first semiconductor layers and the third semiconductor layers are laterally etched by a chemical comprising $CF_4$, $O_2$, $NF_3$, $CHF_3$, $CH_3F$, or a combination thereof.

19. The method for forming the semiconductor device structure as claimed in claim 13, wherein the third semiconductor layers are removed after forming the first gate structure.

20. The method for forming the semiconductor device structure as claimed in claim 13, further comprising forming a power rail in the substrate after forming the second semiconductor stack.

* * * * *